United States Patent
Kim et al.

(10) Patent No.: US 10,573,386 B2
(45) Date of Patent: Feb. 25, 2020

(54) MEMORY DEVICE INCLUDING NAND STRINGS AND METHOD OF OPERATING THE SAME

(71) Applicant: Samsung Electronics Co., Ltd., Suwon-si (KR)

(72) Inventors: Wan-Dong Kim, Seoul (KR);
Tae-Hyun Kim, Seoul (KR);
Sang-Wan Nam, Hwaseong-si (KR);
Sang-Soo Park, Hwaseong-si (KR);
Jae-Yong Jeong, Yongin-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 16/035,958

(22) Filed: Jul. 16, 2018

(65) Prior Publication Data

US 2019/0035466 A1 Jan. 31, 2019

(30) Foreign Application Priority Data

Jul. 28, 2017 (KR) .................. 10-2017-0095914

(51) Int. Cl.
*G11C 16/04* (2006.01)
*G11C 16/08* (2006.01)
(Continued)

(52) U.S. Cl.
CPC .......... *G11C 16/0483* (2013.01); *G11C 16/08* (2013.01); *G11C 16/10* (2013.01);
(Continued)

(58) Field of Classification Search
CPC ......... G11C 16/08; G11C 16/26; G11C 16/28; G11C 16/0483
(Continued)

(56) References Cited

U.S. PATENT DOCUMENTS

| 7,898,872 B2 | 3/2011 | Han |
| 8,670,285 B2 | 3/2014 | Dong et al. |

(Continued)

FOREIGN PATENT DOCUMENTS

KR 20120042274 A 5/2012

*Primary Examiner* — Han Yang
(74) *Attorney, Agent, or Firm* — Muir Patent Law, PLLC

(57) ABSTRACT

To operate a memory device including a plurality of NAND strings, an unselected NAND string among a plurality of NAND strings is floated when a voltage of a selected word line is increased such that a channel voltage of the unselected NAND string is boosted. The channel voltage of the unselected NAND string may be discharged when the voltage of the selected word line is decreased. The load when the voltage of the selected word line increases may be reduced by floating the unselected NAND string to boost the channel voltage of the unselected NAND string together with the increase of the voltage of the selected word line. The load when the voltage of the selected word line is decreased may be reduced by discharging the boosted channel voltage of the unselected NAND string when the voltage of the selected word line is decreased. Through such reduction of the load of the selected word line, a voltage setup time may be reduced and an operation speed of the memory device may be enhanced.

20 Claims, 23 Drawing Sheets

(51) Int. Cl.
    *G11C 16/28*     (2006.01)
    *G11C 16/10*     (2006.01)
    *G11C 16/26*     (2006.01)
    *G11C 16/34*     (2006.01)
    *G11C 11/56*     (2006.01)
    *G11C 16/32*     (2006.01)
    *G11C 5/06*     (2006.01)

(52) U.S. Cl.
    CPC .............. *G11C 16/26* (2013.01); *G11C 16/28* (2013.01); *G11C 5/063* (2013.01); *G11C 11/5628* (2013.01); *G11C 11/5642* (2013.01); *G11C 16/32* (2013.01); *G11C 16/3445* (2013.01); *G11C 16/3459* (2013.01)

(58) Field of Classification Search
    USPC ........................................ 365/185.13, 185.17
    See application file for complete search history.

(56) References Cited

U.S. PATENT DOCUMENTS

| | | |
|---|---|---|
| 9,190,151 B2 | 11/2015 | Nam et al. |
| 9,245,637 B2 | 1/2016 | Yang et al. |
| 9,286,994 B1 * | 3/2016 | Chen ................... G11C 16/08 |
| 9,406,391 B1 | 8/2016 | Chen et al. |
| 2010/0172182 A1 * | 7/2010 | Seol ................... G11C 11/5628 |
| | | 365/185.17 |
| 2011/0199829 A1 * | 8/2011 | Lee ................... G11C 16/0483 |
| | | 365/185.17 |
| 2012/0307561 A1 | 12/2012 | Joo et al. |
| 2016/0358662 A1 | 12/2016 | Chen et al. |
| 2017/0162257 A1 * | 6/2017 | Kato ................... G11C 11/5628 |

\* cited by examiner

MEMORY DEVICE INCLUDING NAND STRINGS AND METHOD OF OPERATING THE SAME

CROSS-REFERENCE TO RELATED APPLICATION

This U.S. non-provisional application claims priority under 35 USC § 119 to Korean Patent Application No. 10-2017-0095914, filed on Jul. 28, 2017, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a memory device including NAND strings and a method of operating the memory device.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory device have been developed to increase degree of integration of memory cells. However, loads of signal lines of such memory devices are undesirably high due to high integration degree and high memory capacity, which leads to decrease of operation speed of the memory device.

SUMMARY

Some example embodiments may provide a method of operating a memory device for increasing an operation speed of a memory device.

Some example embodiments may provide a memory device having an increased operation speed.

According to example embodiments, to operate a memory device including a plurality of NAND strings, a voltage of a selected word line is increased and an unselected NAND string among the plurality of NAND strings is floated when the voltage of the selected word line is increased such that a channel voltage of the unselected NAND string is boosted. The voltage of the selected word line is decreased and the channel voltage of the unselected NAND string may be discharged when the voltage of the selected word line is decreased.

According to example embodiments, a method of performing a read operation of a memory device including a plurality of NAND strings, includes, increasing a voltage of a selected word line to a first read voltage to perform a first sensing operation, floating an unselected NAND string among the plurality of NAND strings when the voltage of the selected word line is increased to the first read voltage such that a channel voltage of the unselected NAND string is boosted, decreasing the voltage of the selected word line from the first read voltage to a second read voltage to perform a second sensing operation, the second read voltage being lower than the first read voltage and discharging the channel voltage of the unselected NAND string when the voltage of the selected word line is decreased from the first read voltage to the second read voltage.

According to example embodiments, a memory device includes a memory cell array including a plurality of NAND string and a control circuit configured to float an unselected NAND string among the plurality of NAND strings when a voltage of a selected word line is increased such that a channel voltage of the unselected NAND string is boosted and configured to discharge the channel voltage of the unselected NAND string when the voltage of the selected word line is decreased.

The memory device and the method of operating the memory device according to example embodiments may reduce the load of the selected word line by changing the voltage of the selected word line and that of the channel voltage of the unselected NAND string in the same direction (e.g., both upwardly or both downwardly).

The load when the voltage of the selected word line increases may be reduced by floating the unselected NAND string to boost the channel voltage of the unselected NAND string at the same time. In contrast, the load when the voltage of the selected word line decreases may be reduced by discharging the boosted channel voltage of the unselected NAND string at the same time. Through such reduction of the load of the selected word line, a voltage setup time may be reduced and an operation speed of the memory device may be enhanced.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
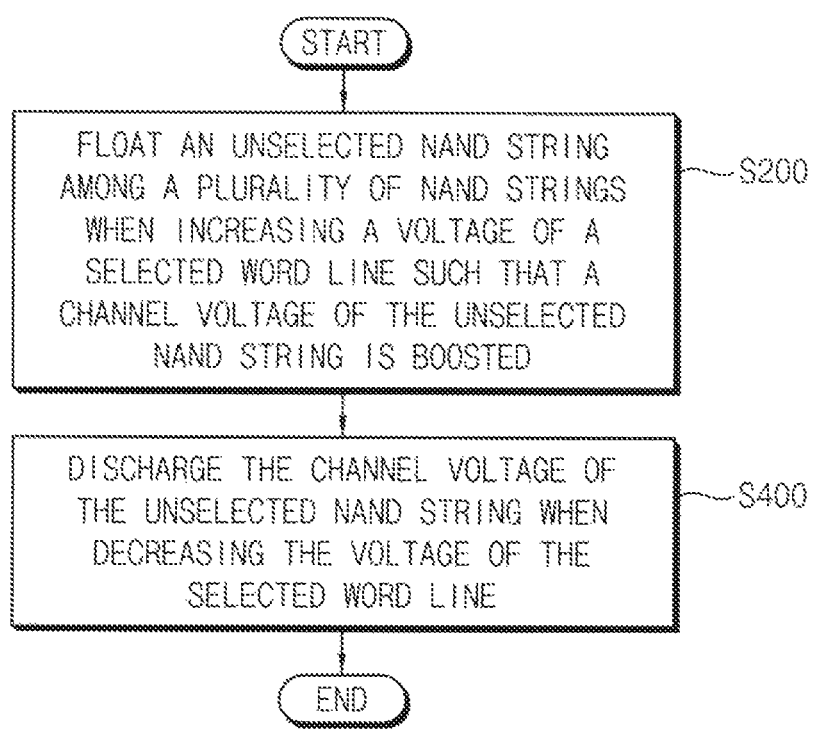
FIG. 1 is a flow chart illustrating a method of operating a memory device according to example embodiments.

Various example embodiments will be described more fully hereinafter with reference to the accompanying drawings, in which some example embodiments are shown. In the drawings, like numerals refer to like elements throughout. Repetitive descriptions may be omitted.

Figure 2:
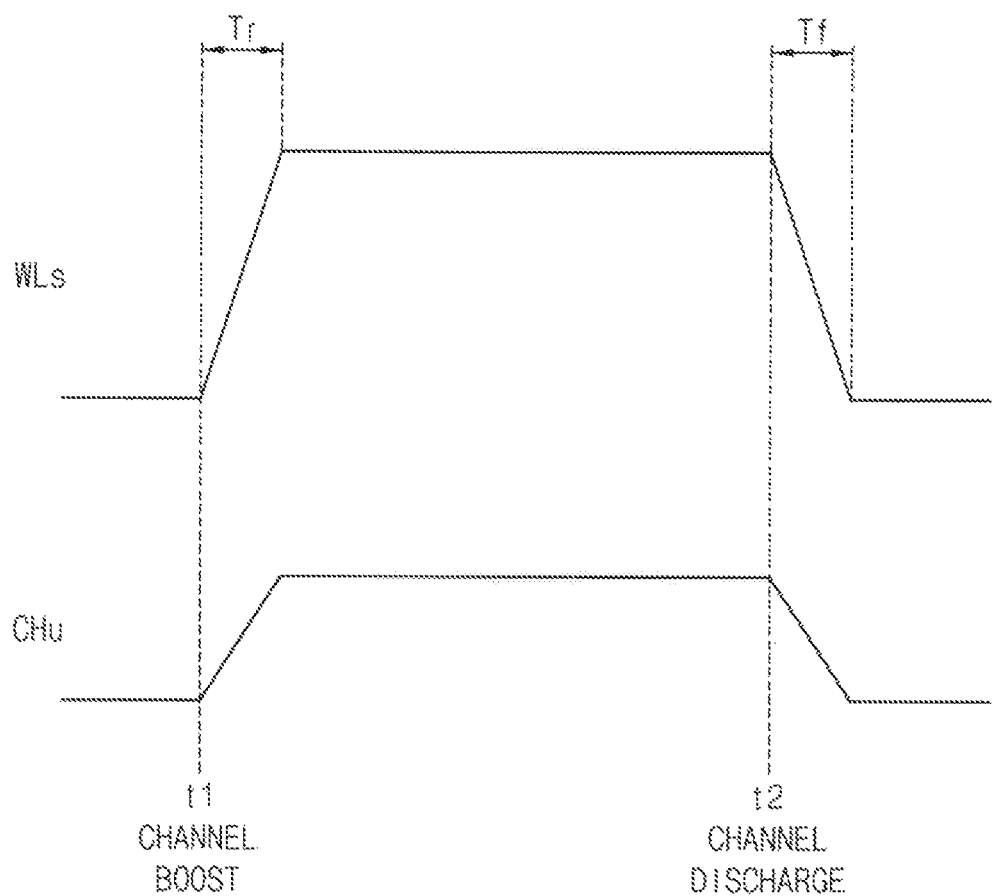
FIG. 2 is a diagram illustrating a concept of a method of operating a memory device according to example embodiments.

FIG. 1 is a flow chart illustrating a method of operating a memory device according to example embodiments, and FIG. 2 is a diagram illustrating a concept of a method of operating a memory device according to example embodiments.

Example embodiments are directed to a memory device including a plurality of NAND strings, which will be described below with reference to FIGS. 4 through 7.

For example, in a three-dimensional NAND flash memory device or a vertical NAND flash memory device, a plurality of NAND strings are commonly connected to a plurality of word lines. Among the NAND strings connected to the same word line, some NAND strings may be selected and the other NAND strings may be unselected.

When particular memory cells are required to be accessed in a read operation and a program operation, a word line and a NAND string corresponding to the particular memory cells may be selected based on an address. As will be described below, a word line may be selected among a plurality of word lines by controlling a voltage of the plurality of word lines and a NAND string may be selected among a plurality of NAND strings by controlling voltages of selection lines such as string selection lines and ground selection lines.

Referring to FIGS. 1 and 2, at time point t1 when increasing a voltage of a selected word line WLs, an unselected NAND string among the plurality of NAND strings is floated such that a channel voltage CHu of the unselected NAND string is boosted (S200). The load when the voltage of the selected word line WLs increases may be reduced by floating the unselected NAND string to boost the channel voltage CHu of the unselected NAND string together. Thus, a voltage rising time Tr of the selected word line may be reduced.

In contrast, at time point t2 when decreasing the voltage of the selected word line WLs, the channel voltage CHu of the unselected NAND string is discharged (S400). For example, the channel voltage CHu of the unselected NAND string may be reduced by electrically connecting the unselected NAND string to a corresponding bit line and a corresponding source line at time point t2. The load of the selected word line WLs may be reduced by discharging the boosted channel voltage CHu of the unselected NAND string at the same time the voltage of the selected WLs is decreased. Thus, a voltage falling time Tf of the selected word line may be reduced.

In general, the word lines WL (one of which may be the selected word line WLs and others which may constitute unselected WLu) may be operatively connected to a plurality of NAND strings (some of which may be selected and some of which may be unselected). Thus, many unselected NAND strings may be connected to the selected word line WLs and the channels of the unselected NAND strings capacitive couple with the selected word line WLs to create heavy loads on the selected word line WLs. In addition, the unselected NAND strings may likewise create heavy loads on the unselected word lines WLu. The memory device and the method of operating the memory device according to example embodiments may reduce the load of the selected word line WLs by having the change of the voltage of the selected word line WLs and the change of the channel voltage CHu of the unselected NAND string(s) occur in the same direction. Similar coordination of changes of voltages may be performed with respect to the unselected NAND string(s) and the unselected word lines WLu. Through such reduction of the load of the selected word line WLs, voltage setup times, (e.g., the voltage rising time Tr and the voltage falling time Tf described with respect to FIG. 2) may be reduced and an operation speed of the memory device may be enhanced.

Figure 3:
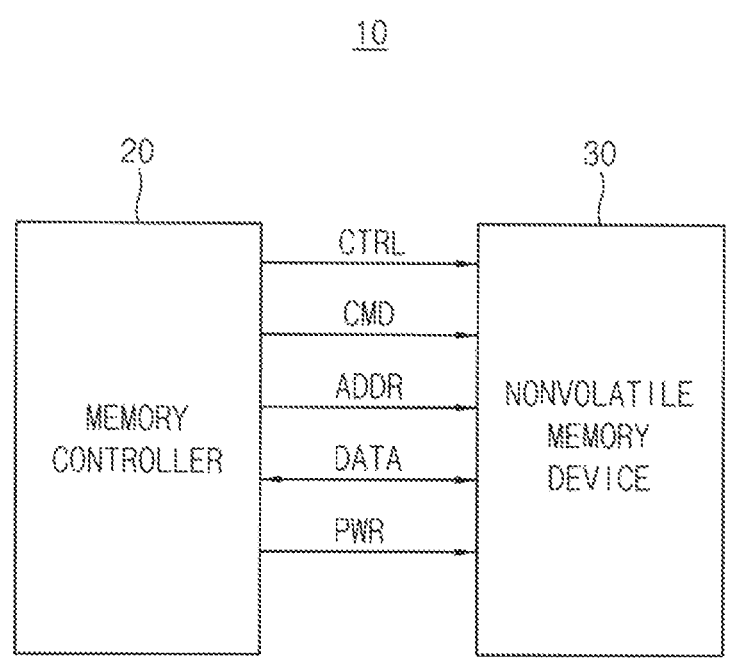
FIG. 3 is a block diagram illustrating a memory system according to example embodiments.

FIG. 3 is a block diagram illustrating a memory system according to example embodiments.

Referring to FIG. 3, a memory system 10 may include a memory controller 20 and at least one memory device 30.

The memory device 30 may be a nonvolatile memory device as described herein. The memory system 10 may include data storage media based on flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

Figure 4:
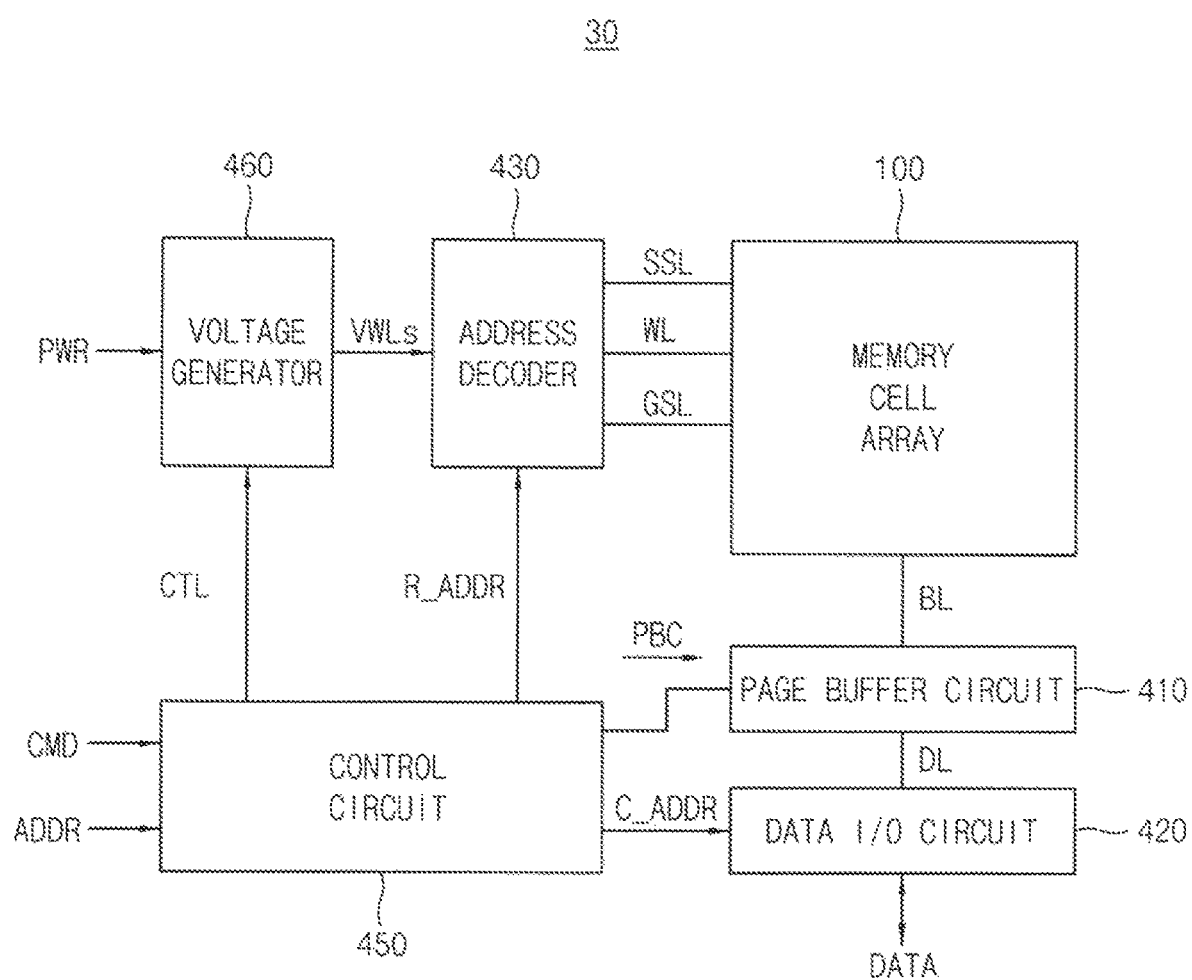
FIG. 4 is a block diagram illustrating an example embodiment of a nonvolatile memory device included in the memory system of FIG. 3.

FIG. 4 is a block diagram illustrating an example embodiment of a nonvolatile memory device included in the memory system of FIG. 3.

Referring to FIG. 4, the nonvolatile memory device 30 includes a memory cell array 100, an address decoder 430, a page buffer circuit 410, a data input/output circuit 420, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell. In other example embodiments, the memory cell array 100 may be a two-dimensional memory cell array, which is formed on a substrate in a two-dimensional structure (or a horizontal structure).

The control circuit 450 may receive a command (signal) CMD and an address (signal) ADDR from the memory controller 20 and control erasure, programming and read operations of the nonvolatile memory device 30 based on the command signal CMD and the address signal ADDR. An erasure operation may comprise performing a sequence of erase loops, and a program operation may comprises performing a sequence of program loops. Each program loop may include a program operation and a program verification operation. Each erase loop may include an erase operation and an erase verification operation. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine rest of the plurality of string selection lines SSL except for the selected string selection line as unselected string selection lines based on the row address R_ADDR. Also, the address decoder 430 may determine one of the plurality of ground selection lines GSL as a selected ground selection line and determine rest of the plurality of ground selection lines GSL except for the selected ground selection line as unselected ground selection lines based on the row address R_ADDR. NAND strings connected between the selected string selection line SSL and the selected ground selection line GSL may thus be selected string selection lines SSL for this particular read operation. Similarly, NAND strings connected between the unselected string selection lines SSL and the unselected ground selection lines GSL may thus be unselected string selection lines SSL for this particular read operation.

According to example embodiments, the control circuit 450 may float the unselected NAND strings when increasing the voltage of the selected word line so that the channel voltage of the unselected NAND strings may be boosted. When a NAND string is floated, the channel of the NAND string (the series connection of the channels of the memory transistors that form the memory cells of the NAND string) are not connected to another electrical node (e.g., electrical charge of the floated NAND string is maintained and no DC current flows between the floated NAND string and another electrical node). In addition, the control circuit 450 may discharge the channel voltage of the unselected NAND strings when decreasing the voltage of the selected word line. Although plural unselected NAND strings may be simultaneously controlled to be simultaneously floated and discharged in such a manner, the description herein may refer to a single unselected NAND string for simplicity of description. Similarly, although plural selected NAND strings may be simultaneously controlled in operations described herein, a single selected NAND string may be referenced for simplicity of this description.

The voltage generator 460 may generate word line voltages VWL, which are required for the operation of the memory cell array 100 of the nonvolatile memory device 30, based on the control signals CTL. The voltage generator 460 may receive the power PWR from the memory controller 20. The word line voltages VWL may be applied to the plurality of word lines WL through the address decoder 430.

For example, during the erase operation, the voltage generator 460 may apply an erase voltage to a well of a memory block and may apply a ground voltage to all of the word lines of the memory block. During the erase verification operation, the voltage generator 460 may apply an erase verification voltage to all of the word lines of the memory block or sequentially apply the erase verification voltage to the word lines one by one.

For example, during the program operation, the voltage generator 460 may apply a program voltage to the selected word line and may apply a program pass voltage to the unselected word lines. In addition, during the program verification operation, the voltage generator 460 may apply a program verification voltage to the first word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 410 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device 30, such as to the memory controller 20). That is, the page buffer circuit 410 and the data input/output circuit 420 may perform a copy-back operation.

Figure 5:
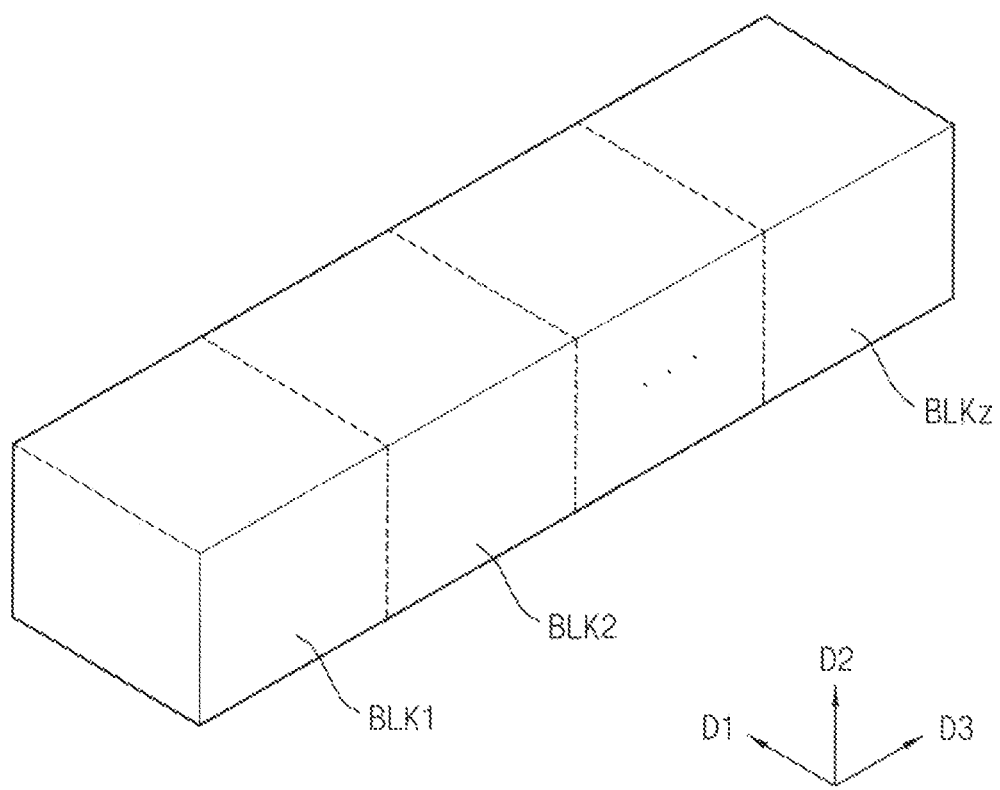
FIG. 5 is a block diagram illustrating a memory cell array included in the nonvolatile memory device of FIG. 4.
Figure 6:
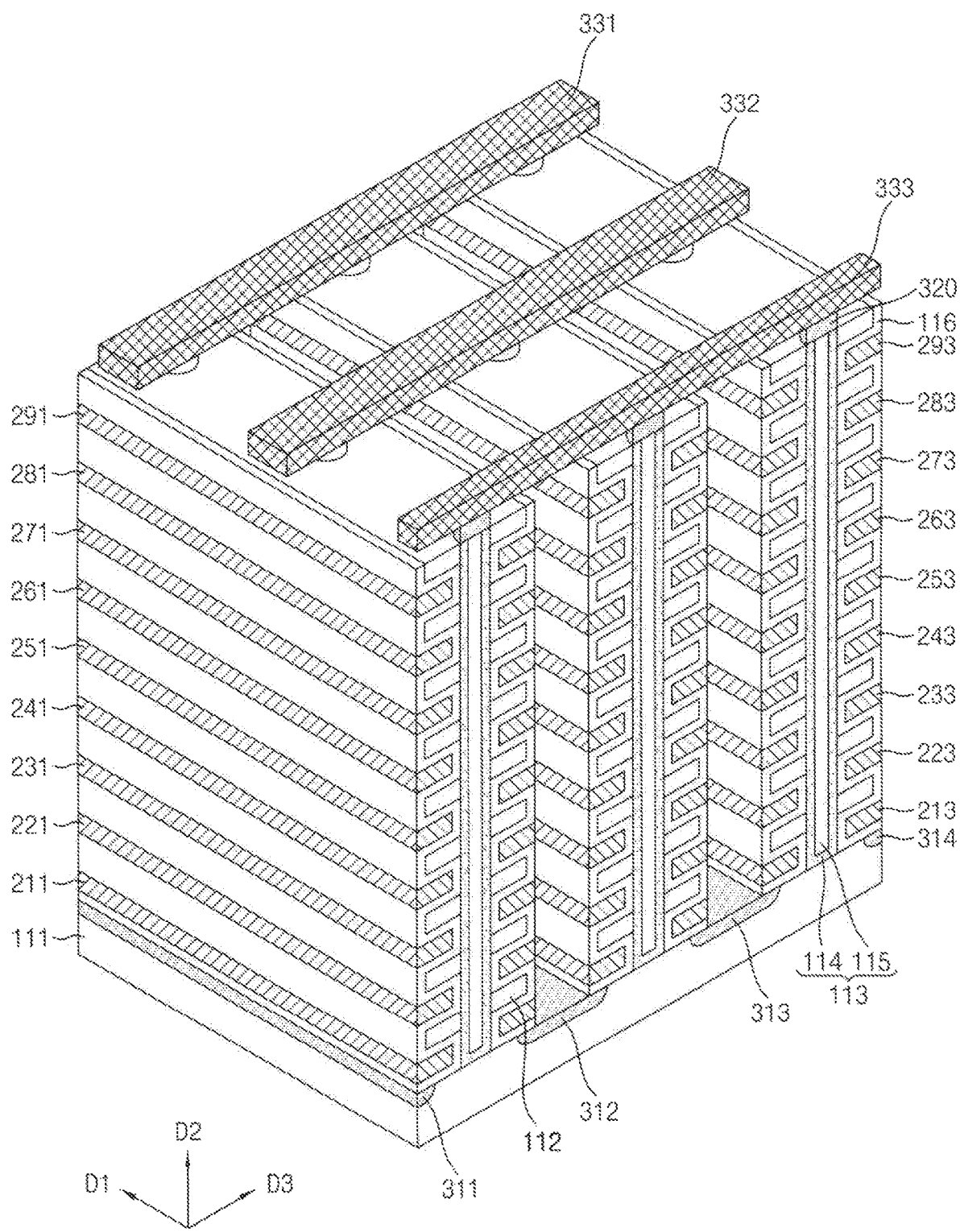
FIG. 6 is a perspective view illustrating one of memory blocks of FIG. 5.

FIG. 5 is a block diagram illustrating a memory cell array included in the nonvolatile memory device of FIG. 4, and FIG. 6 is a perspective view illustrating one of memory blocks of FIG. 5.

Referring to FIG. 5, the memory cell array 100 may include a plurality of memory blocks BLK1 to BLKz. In an embodiment, the memory blocks BLK1 to BLKz are selected by the address decoder 430 in FIG. 4. For example, the address decoder 430 may select a particular memory block BLK corresponding to a block address among the memory blocks BLK1 to BLKz.

Referring to FIG. 6, a memory block BLKi includes NAND strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials 112 are provided along the second direction D2, being spaced by a specific distance. For example, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 and may be interposed between pillars 113 and conductive materials 211 to 291. In some examples, the insulation layer 116 need not be provided between the conductive materials 211 to 291 corresponding to the ground select lines GSL (e.g., 211, 213) and string select lines SSL (e.g., 291, 293). In this example, the ground select lines GSL are the lower-most ones of the stack of conductive materials 211 to 291 and the string select lines SSL are the uppermost ones of the stack of conductive materials 211 to 291).

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the third direction D3 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the third direction D3.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the third direction D3, a plurality of pillars 113 disposed sequentially along the third direction D3 and penetrating the plurality of insulation materials 112 along the second direction D2, an insulation layer 116 provided on the exposed surfaces of the plurality of insulation materials 112 and the plurality of pillars 113, and a plurality of first conductive materials 213 to 293 extending along the third direction D3.

Drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

Figure 7:
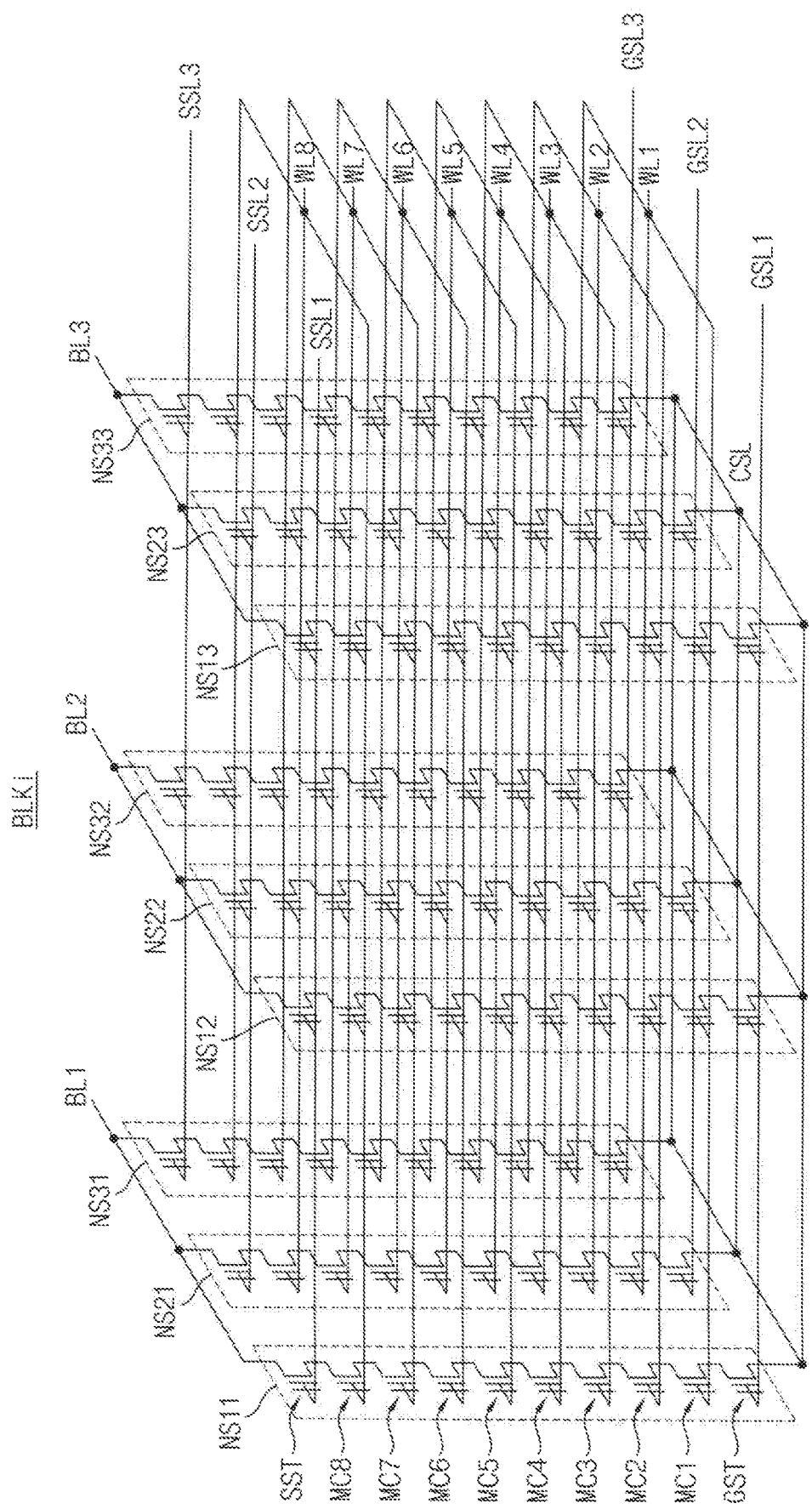
FIG. 7 is a circuit diagram illustrating an equivalent circuit of the memory block described with reference to FIG. 6.

FIG. 7 is a circuit diagram illustrating an equivalent circuit of the memory block described with reference to FIG. 6. The circuit of FIG. 7 may be configured to receive the voltages and perform the operations described herein, such as with respect to the embodiments of FIGS. 10-13.

The memory block BLKi of FIG. 7 may be formed on a substrate in a three-dimensional structure (or a vertical structure). For example, a plurality of NAND strings or NAND strings included in the memory block BLKi may be formed in a direction perpendicular to the substrate.

Referring to FIG. 7, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 7, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding word lines WL1 to WL8, respectively. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL. In the example of FIG. 7, some of the string selection transistors SST are connected to the same bit line (one of BL1, BL2, BL3) to connect corresponding NAND strings NS to the same bit line up appropriate selection via selection voltages applied to the appropriate sting selection lines SSL1 to SSL3 and ground selection lines GSL1 to GSL3.

Word lines (e.g., WL1) having the same height may be commonly connected, and the ground selection lines GSL1 to GSL3 and the string selection lines SSL1 to SSL3 may be separated. In FIG. 7, the memory block BLKi is illustrated to be coupled to eight WL1 to WL8 and three bit lines BL1 to BL3. However, example embodiments are not limited thereto. Each memory block in the memory cell array 100 may be coupled to any number of word lines and any number of bit lines.

Figure 8:
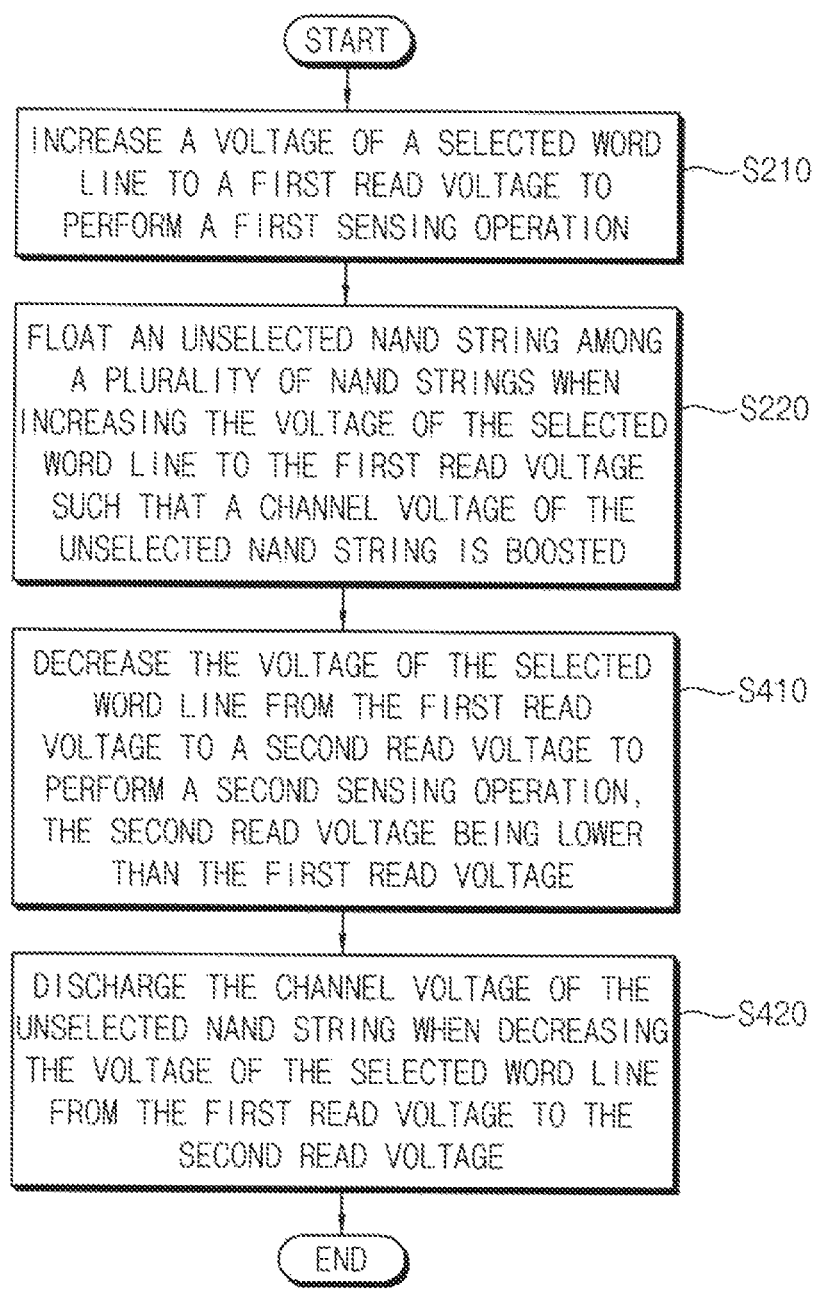
FIG. 8 is a flow chart illustrating a read operation method in a memory device according to example embodiments.

FIG. 8 is a flow chart illustrating a read operation method in a memory device according to example embodiments.

Referring to FIG. 8, a voltage of a selected word line is increased to a first read voltage to perform a first sensing operation (S210). An unselected NAND string among a plurality of NAND strings is floated when increasing the voltage of the selected word line to the first read voltage such that a channel voltage of the unselected NAND string is boosted (S220).

The voltage of the selected word line is decreased from the first read voltage to a second read voltage to perform a second sensing operation, where the second read voltage is lower than the first read voltage (S410). The channel voltage of the unselected NAND string is discharged when decreasing the voltage of the selected word line from the first read voltage to the second read voltage (S420)

As such, the method of performing the read operation of the memory device according to example embodiments may reduce the load of the selected word line by simultaneously changing the voltage of the selected word line and changing the channel voltage of the unselected NAND string in the same direction. Through such reduction of the load of the selected word line, a voltage setup time may be reduced and an operation speed of the memory device may be enhanced.

Hereinafter, a method of performing a read operation of a memory device will be described below with reference to FIGS. 9 through 16.

Figure 9:
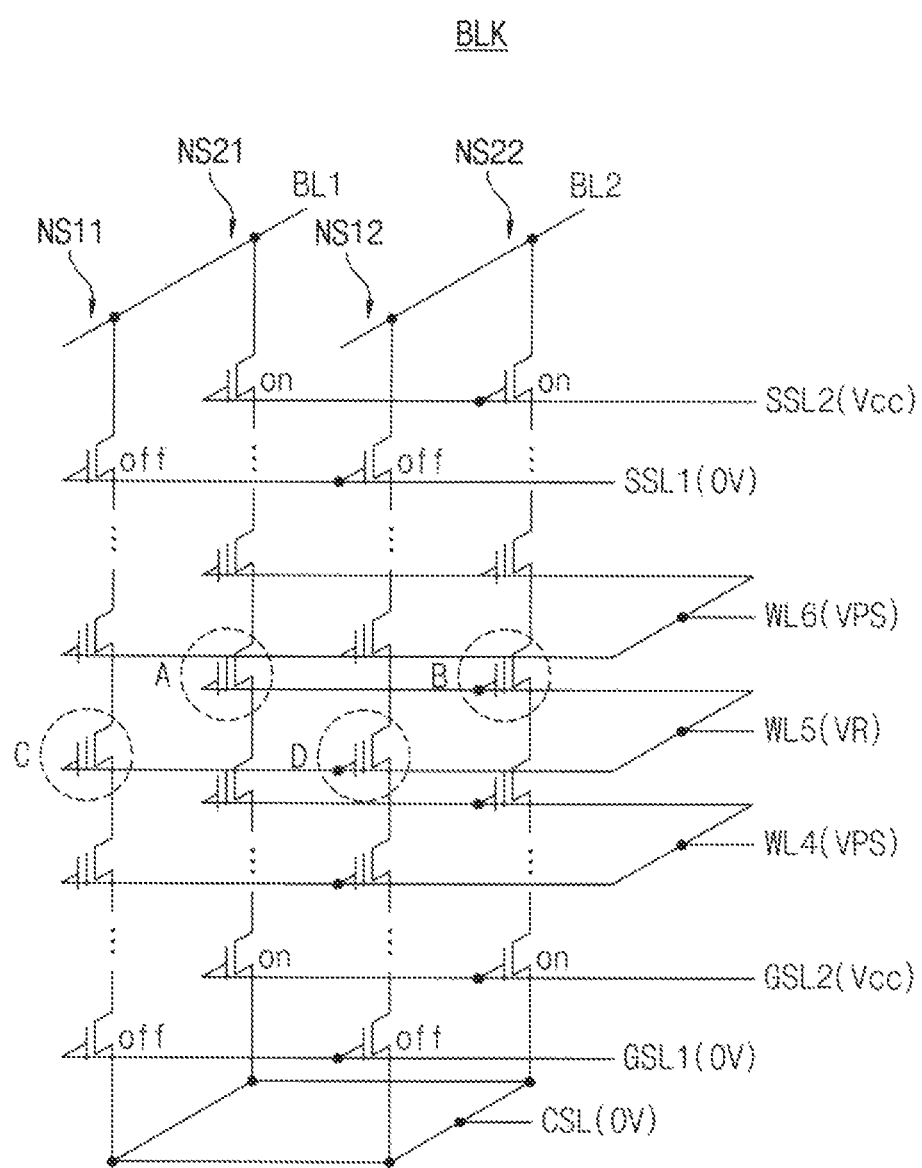
FIG. 9 is a circuit diagram illustrating a read bias condition of a three-dimensional flash memory device.

FIG. 9 is a circuit diagram illustrating a read bias condition of a three-dimensional flash memory, such as that described with respect to embodiments described herein (e.g., FIGS. 6 and 7). Only a subset of the wordlines implemented in the 3D NAND flash memory of FIG. 9 is illustrated. The circuit of FIG. 9 may be configured to receive the voltages and perform the operations described herein, such as with respect to the embodiments of FIGS. 10-13.

For convenience of description, NAND strings NS11 and NS21 connected to a first bit line BL1 and NAND strings NS12 and NS22 connected to a second bit line BL2 are illustrated in FIG. 9.

The first bit line BL1 and the second bit line BL2 may be pre-charged with a pre-charge voltage (e.g., 0.5 V). During a read operation, if NAND strings NS21 and NS22 are selected, a voltage of 0 V may be applied to the first string selection line SSL1 and a power supply voltage Vcc may be applied to the second string selection line SSL2. Furthermore, the voltage of 0 V may be applied to a first ground selection line GSL1 and the power supply voltage Vcc may be applied to a second ground selection line GSL2. A selection read voltage VR may be applied to a selected word line (e.g., WL5) and the non-selection read voltage VPS may be applied to unselected word lines (e.g., WL4 and WL6).

In this exemplary read bias condition, the drain voltage of selected memory cells A and B is 0.5 V and the source voltage of selected memory cells A and B is 0 V. In addition, the selection read voltage VR is applied to gates of the selected memory cells A and B. Furthermore, a read operation for verifying data stored at a memory cell may be performed while changing a voltage level of the selection read voltage VR. Channels of unselected NAND strings NS11 and NS12 including memory cells C and D are floated. Specifically, the series connection of the memory transistors constituting the memory cells of each unselected NAND string (here, NS11 and NS12) is floated due to the corresponding string select transistor and gate select transistor being off. When the voltages of the word lines WL are increased (e.g., to the selection read voltage VR or the non-selection read voltage VPS), capacitive coupling between the word lines acts to increase the voltage of the channels of the unselected NAND strings NS11 and NS12.

According to example embodiments, in the read operation, the load of the selected word line (e.g., WL5) may be reduced by simultaneously changing the voltage of the selected word line (e.g., WL5) the channel voltage of the unselected NAND strings (e.g., NS11, NS12) in the same direction (e.g., simultaneously increasing these voltages or simultaneously decreasing these voltages).

In FIGS. 10, 11, 12 and 13, the selected word line WLs corresponds to the word line WL5 in FIG. 9 and the unselected NAND string corresponds to any of the NAND strings NS11 and NS12 in FIG. 9.

FIGS. 10, 11, 12 and 13 are timing diagrams illustrating a read operation methods in a memory device according to example embodiments.

Figure 10:
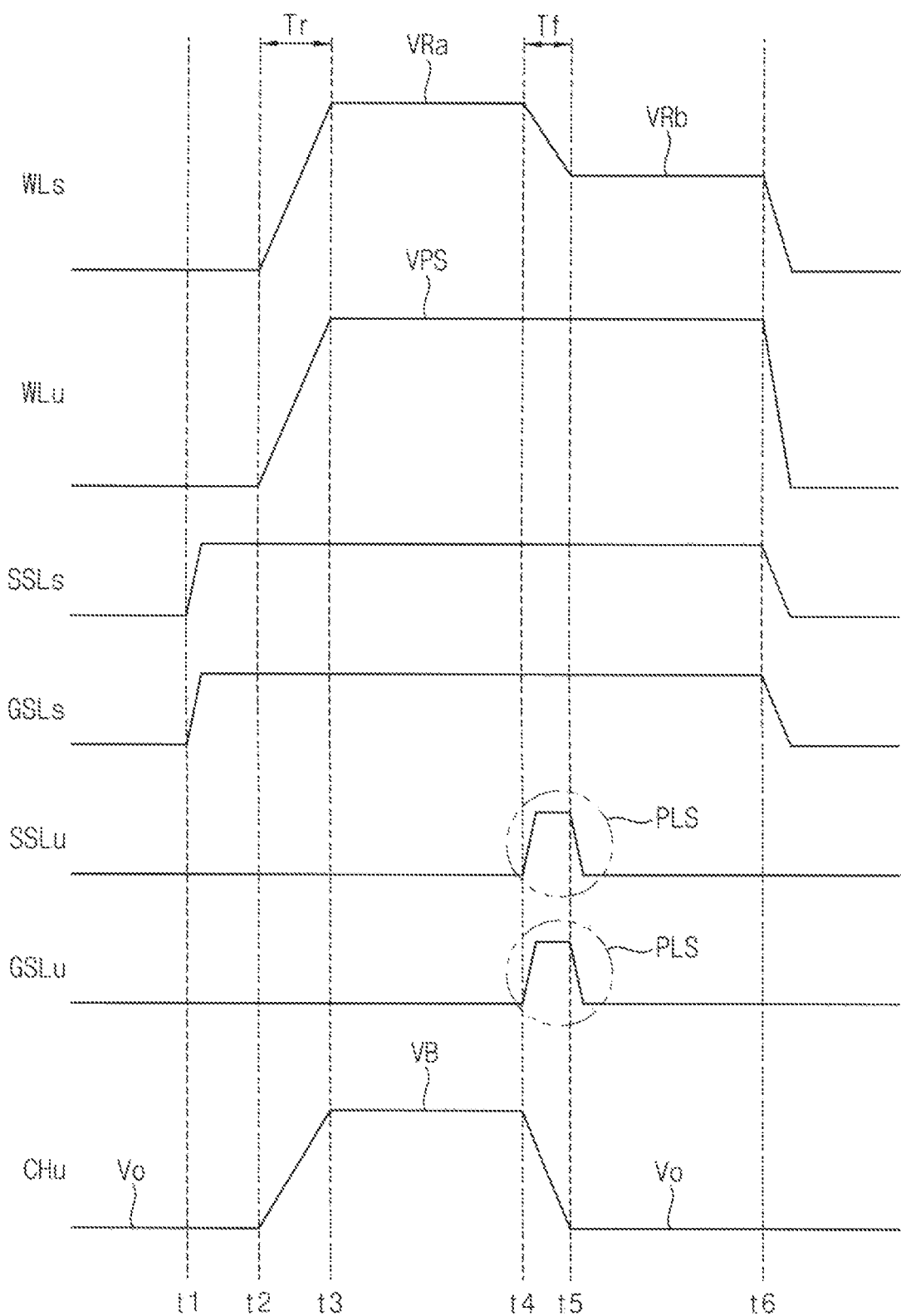
FIGS. 10, 11, 12 and 13 are timing diagrams illustrating a read operation methods in a memory device according to example embodiments.

Referring to FIG. 10, at time point t1, a selected NAND string for the read operation may be determined by activating a voltage of a selected string selection line SSLs to electrically connect the selected NAND string and a corresponding bit line and to activate a voltage of a selected ground selection line GSLs to electrically connect the selected NAND string and a source line (e.g., common source line CSL of FIG. 9).

During time interval t2~t3, the voltage of the selected word line WLs is increased to a first read voltage VRa and the voltage of the unselected word line WLu is increased to the non-selection read voltage VPS to perform a first sensing operation. The non-selection read voltage VPS may be larger than the first read voltage VRa to assure that the memory cells of connected to the unselected word lines WLu are turned on without dependence of their programming. The first read voltage VRa may have a lower value so that memory cells connected to the selected word line WLs are turned on or off in dependence on their programming. In some example embodiments, the voltage of the unselected word line WLu may be increased in advance before the voltage of the selected word line WLs is increased. In either of these options, the increase of the voltages of the word lines WL occurs while the unselected NAND string is floated.

According to example embodiments, when increasing the voltage of the selected word line WLs (t2~t3), the voltage of the unselected string selection line SSLu and the voltage of the unselected ground selection line GSLu may maintain the deactivated voltage level. Accordingly, the unselected NAND string may be floated and the channel voltage CHu of the unselected NAND string may be increased from an initial voltage Vo to a boosted voltage VB.

As such, the load when the voltage of the selected word line WLs increases may be reduced by floating the unselected NAND string to boost the channel voltage CHu of the unselected NAND string together, and thus the voltage rising time Tr of the selected word line WLs may be reduced.

During time interval t4~t5, the voltage of the selected word line WLs is decreased from the first read voltage VRa to a second read voltage VRb lower than the first read VRa to perform a second sensing operation. In some example embodiments, the second read voltage VRb may be lower than a ground voltage (0V), that is, the second read voltage VRb may have a negative voltage level.

According to example embodiments, when decreasing the voltage of the selected word line WLs from the first read voltage VRa to the second read voltage VRb (t4~t5), the voltage of the unselected string selection line SSLu and the voltage of the unselected ground selection line GSLu may be activated in a form of a pulse PLS, thereby turning on corresponding string select transistors and gate select transistors of the unselected NAND string to connect the channel of the unselected NAND string to a corresponding bit line and the common source line. Accordingly the channel voltage Chu of the unselected NAND string may be discharged from the boosted voltage VB to the initial voltage Vo.

As such, the load when the voltage of the selected word line WLs decreases may be reduced by discharging the boosted channel voltage of the unselected NAND string together, and thus the voltage falling time Tf of the selected word line WLs may be reduced. The unselected NAND string and the selected word line WL may be capacitively coupled so that lowering the voltage of the unselected NAND string causes the voltage of the selected word line WL to be lowered. In some examples, during time interval t4~t5, the voltage of the selected word line WLs is decreased from the first read voltage VRa to the lower second read voltage VRb by both directly connecting the selected word line WLs to a lower driving voltage by address decoder 430 and reducing the voltage of the selected word line WL by lowering the voltage of the unselected NAND string.

At time point t6, the voltages are reset or initialized and the sequence of the read operation is finished.

As such, the setup time may be reduced through the load reduction due to boosting or discharging of the channel voltage of the unselected NAND string, and thus the read speed of the memory device may be enhanced.

Figure 11:
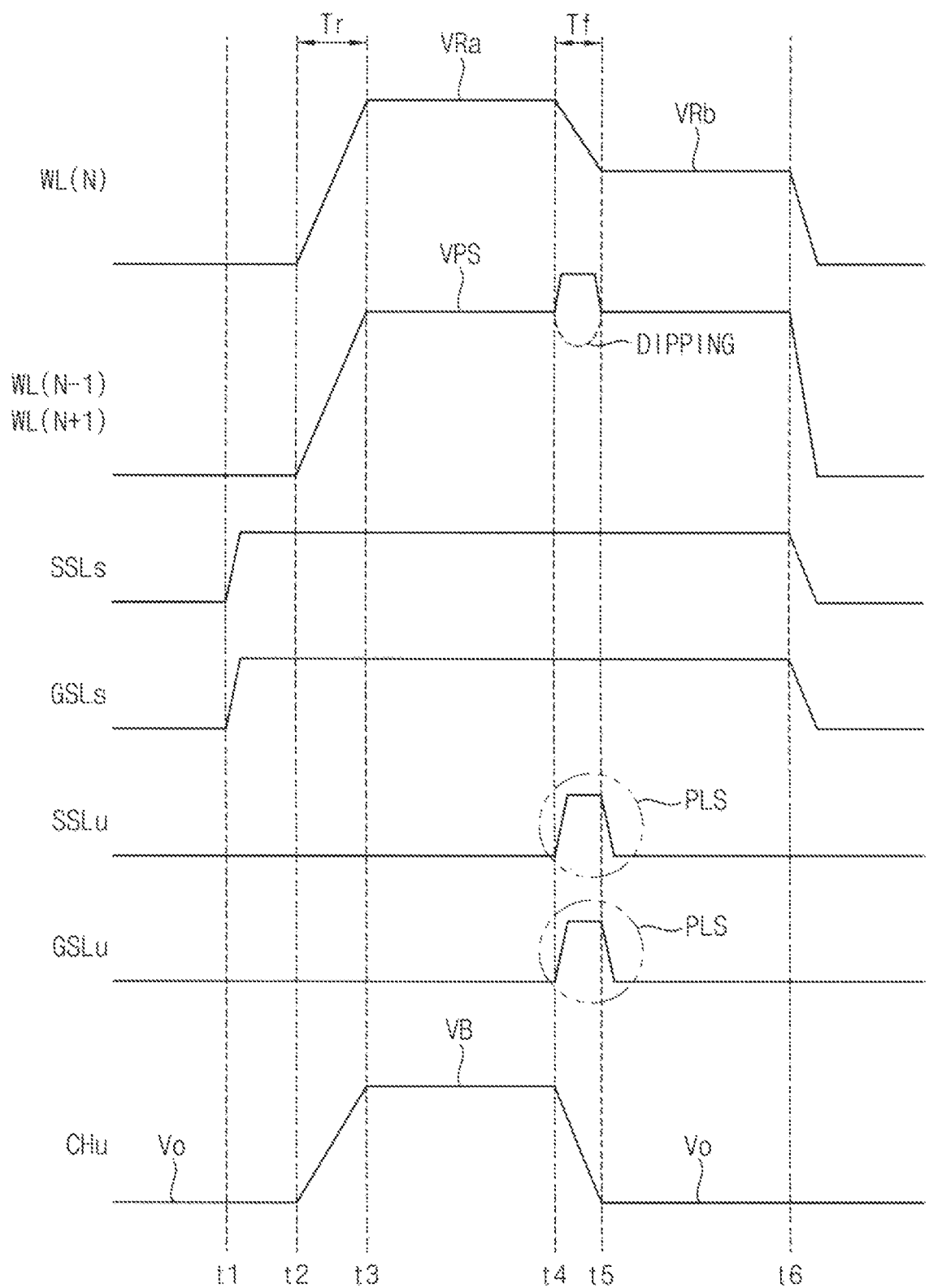

An embodiment of FIG. 11 is similar to the embodiment of FIG. 10, and thus the repeated descriptions may be omitted. In FIG. 11, an N-th word line WL(N) corresponds to the selected word line WLs and (N−1)-th and (N+1)-th word lines WL(N−1) and WL(N+1) are adjacent to the selected word line WL(N).

Referring to FIG. 11, when decreasing the voltage of the selected word line WL(N) from the first read voltage Vra to the second read voltage VRb (t4~t5), the voltage of the adjacent word lines WL(N−1) and W(N_1) may be increased temporarily to a level higher than the non-selection read voltage VPS. In the high-to-low read sequence as illustrated in FIGS. 10 and 11, dipping may occur in the voltage level of the adjacent word lines WL(N−1) and WL(N+1) during the time interval t4~t5. Such dipping phenomenon may be prevented by temporarily increasing the voltage of the adjacent word lines WL(N−1) and WL(N+1). It will be appreciated that the temporary increase of the voltage of adjacent word lines WL(N−1) and WL(N+1) of the embodiment of FIG. 11 may also be implemented in other embodiments described herein, such as those with respect to FIGS. 12 and 13.

Figure 12:
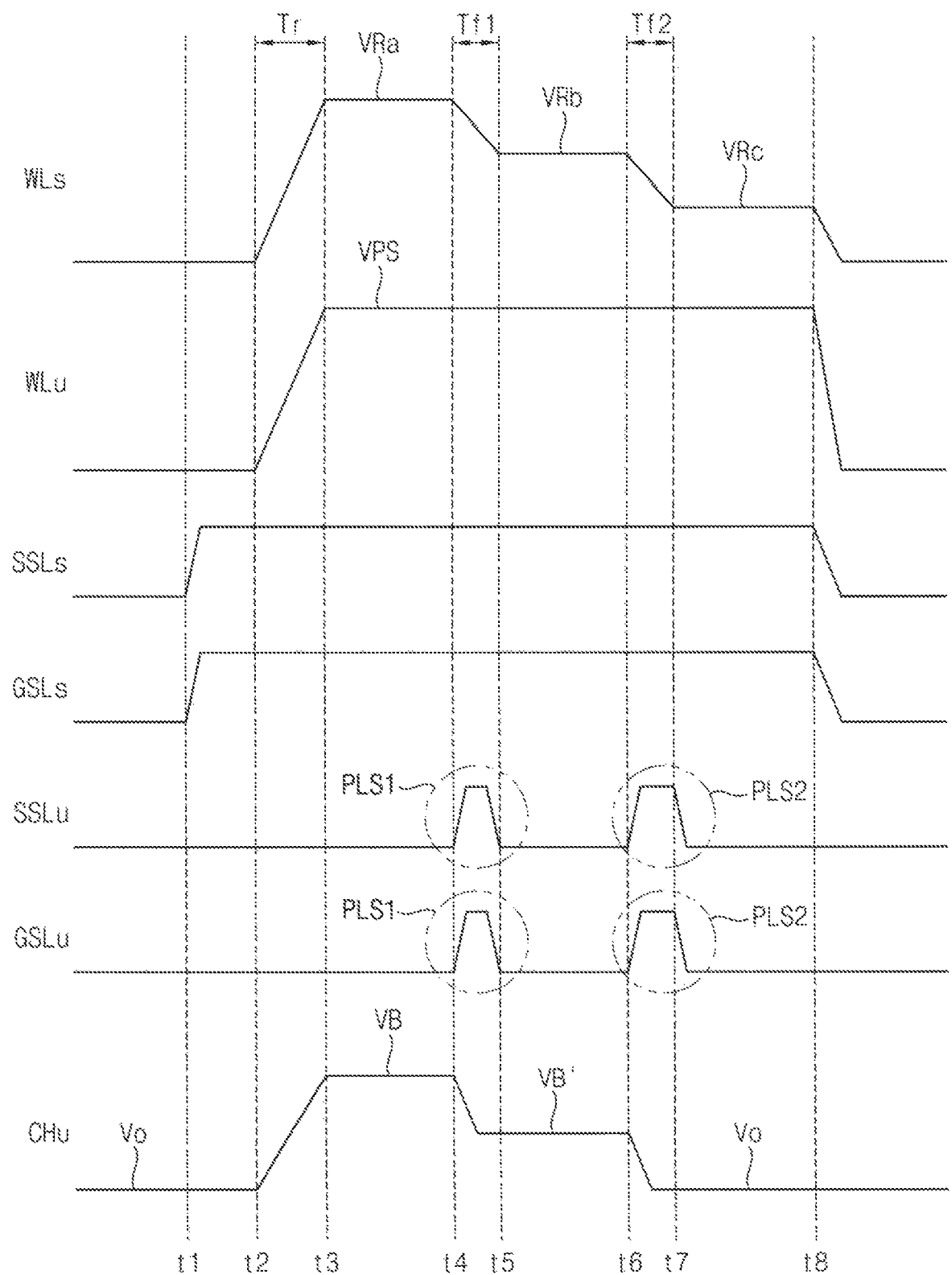

Referring to FIG. 12, at time point t1, a selected NAND string for the read operation may be determined by activating a voltage of a selected string selection line SSLs to electrically connected the selected NAND string to a corresponding bit line and activate a voltage of a selected ground selection line GSLs to electrically connected the selected NAND string and a source line.

During time interval t2~t3, the voltage of the selected word line WLs is increased to a first read voltage VRa and the voltage of the unselected word line WLu is increased to the non-selection read voltage VPS to perform a first sensing operation. In some example embodiments, the voltage of the unselected word line WLu may be increased in advance before the voltage of the selected word line WLs is increased.

According to example embodiments, when increasing the voltage of the selected word line WLs (t2~t3), the voltage of the unselected string selection line SSLu and the voltage of the unselected ground selection line GSLu may maintain the deactivated voltage level. Accordingly, the unselected NAND string may be floated and the channel voltage CHu of the unselected NAND string may be increased from an initial voltage Vo to a boosted voltage VB. The initial voltage Vo may be a reference voltage, e.g., such as ground.

As such, the load when the voltage of the selected word line WLs increases may be reduced by floating the unselected NAND string to boost the channel voltage CHu of the unselected NAND string together, and thus the voltage rising time Tr of the selected word line WLs may be reduced.

During time interval t4~t5, the voltage of the selected word line WLs is decreased from the first read voltage VRa to a second read voltage VRb lower than the first read VRa to perform a second sensing operation. In addition, during time interval t6~t7, the voltage of the selected word line WLs is decreased from the second read voltage VRb to a third read voltage VRc lower than the second read VRb to perform a third sensing operation. In some example embodiments, the second read voltage VRb and the third read voltage VRc may be lower than a ground voltage (0V), that is, the second read voltage VRb may have a negative voltage level. In other example embodiment, the second read voltage VRb may have a positive voltage level and the third read voltage VRc may have a negative voltage level.

According to example embodiments, when decreasing the voltage of the selected word line WLs from the first read voltage VRa to the second read voltage VRb (t4~t5), the voltage of the unselected string selection lines SSLu and the voltage of the unselected ground selection lines GSLu may be activated in a form of a first pulse PLS1 to thereby turn on string select transistors SST and gate select transistors GST to which the unselected string selection lines SSLu and the unselected ground selection lines GSLu are connected. The channel voltage CHu of the unselected NAND strings may be discharged from the boosted voltage VB to an intermediate voltage VB'. When decreasing the voltage of the selected word line WLs from the first read voltage VRa to the second read voltage VRb during time period t4~t5, the unselected NAND strings may be directly electrically connected to a corresponding bit line BL and the common source line CSL by a corresponding string select transistor SST and gate select transistor GST, respectively. Such bit line BL and common source line CSL may be driven at a voltage lower than the intermediate voltage VB' (such as the initial voltage Vo) and allow the unselected NAND strings to discharge to the intermediate voltage VB'. However, fully discharging the unselected NAND strings to the voltage of the bit lines BL and commons source line CSL may be prevented during time period t4~t5 by making the pulse width of pulses PLS1 (corresponding to the time of activation of the corresponding string select transistor SST and gate select transistor GST) small to not provide sufficient time to fully discharge the unselected NAND strings. In addition, when decreasing the voltage of the selected word line WLs from the second read voltage VRb to the third read voltage VRc (t6~t7), the voltage of the unselected string selection lines SSLu and the voltage of the unselected ground selection lines GSLu may be activated in a form of a second pulse PLS2. The channel voltage CHu of the unselected NAND strings may be discharged from the intermediate voltage VB' to the initial voltage Vo. As will be appreciated, the pulse width of the second pulse PLS2 may be larger than the pulse width of the first pulse PLS1 to provide sufficient time to fully discharge the unselected NAND string to the voltage of the bit line BL and commons source line CSL (e.g., to the initial voltage Vo).

As such, the load when the voltage of the selected word line WLs decreases sequentially form the first voltage level VRa to the third voltage level VRc may be reduced by sequentially discharging the boosted channel voltage of the unselected NAND strings, and thus the voltage falling times Tf1 and Tf2 of the selected word line WLs may be reduced.

According to example embodiments, the channel voltage CHu of the unselected NAND strings may be discharged sequentially by adjusting pulse widths or voltage levels of the first pulse PLS1 and the second pulse PLS2. For example, the intermediate voltage VB' may be lowered as the pulse width of the first pulse PLS1 is increased and/or the voltage level of the first pulse PLS is increased.

At time point t8, the voltages are reset or initialized and the sequence of the read operation is finished.

As such, the setup time may be reduced through the load reduction due to boosting or discharging of the channel voltage of the unselected NAND strings, and thus the read speed of the memory device may be enhanced.

Figure 13:
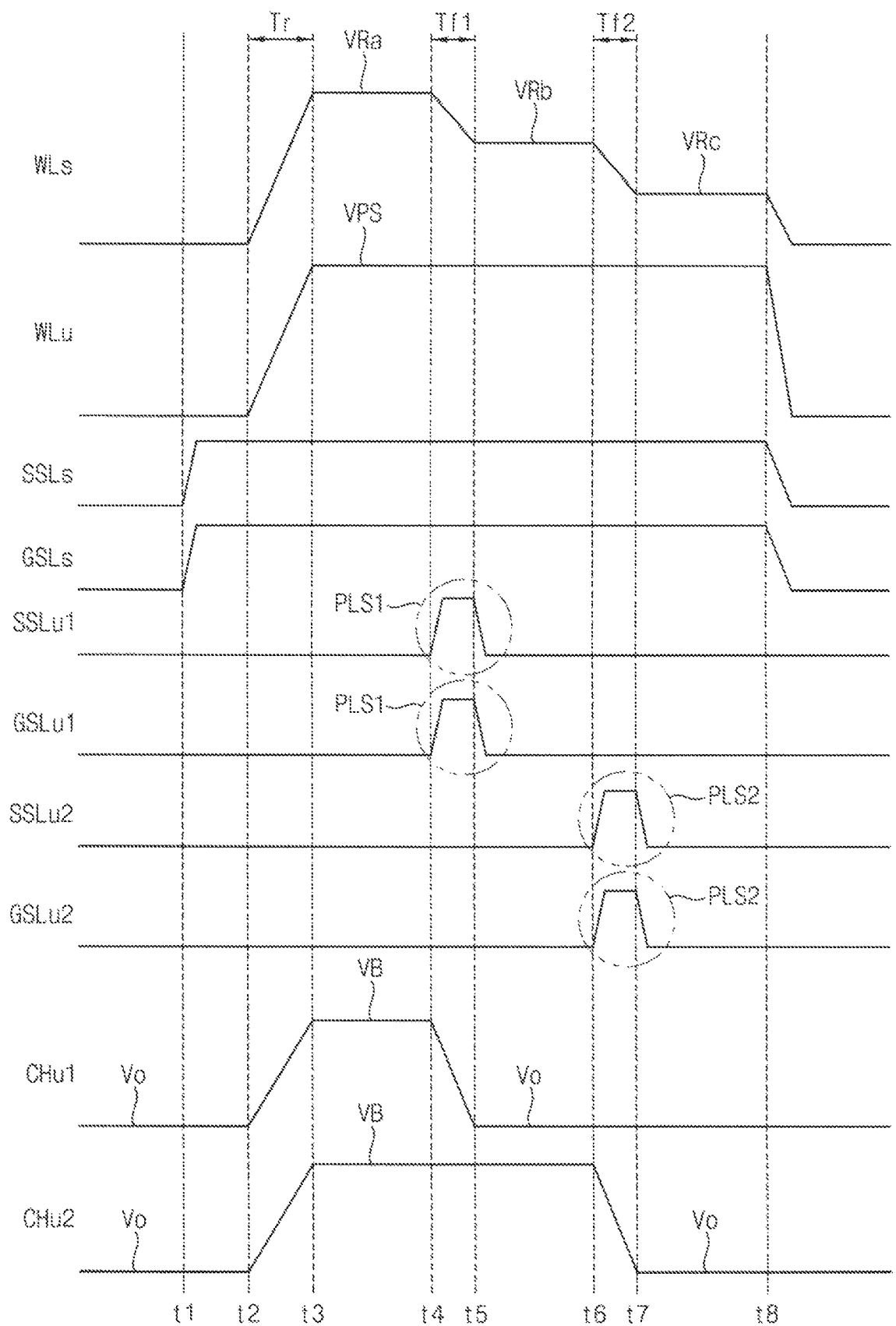

An embodiment of FIG. 13 is similar to the embodiment of FIG. 12, and thus the repeated descriptions may be omitted. FIG. 13 illustrates an embodiment that the channel voltage is discharged by grouping the unselected NAND strings when the voltage of the selected word line WLs is decreased sequentially.

For example, the unselected NAND strings may be grouped into the first unselected NAND strings controlled by the first unselected string selection lines SSLu1 and the first unselected ground selection lines GSLu1 and the second unselected NAND strings controlled by the second unselected string selection lines SSLu2 and the second unselected ground selection lines GSLu2.

Referring to FIG. 13, the channel voltage of the first unselected NAND strings may be discharged when the voltage of the selected word line WLs is decreased from the first read voltage VRa to the second read voltage VRb (t4~t5), and the channel voltage of the second unselected NAND strings may be discharged when the voltage of the selected word line WLs is decreased from the second read voltage VRb to the third read voltage VRb (t6~t7).

During the time interval t4~t5, the channel voltage CHu1 of the first unselected NAND strings may be discharged from the boosted voltage VB to the initial voltage Vo, by activating the voltages of the first unselected string selection lines SSLu1 and the first unselected ground selection lines GSLu1 in a form of a first pulse PLS1. During time period t4~t5, each of the first unselected NAND strings may be directly electrically connected to a corresponding bit line BL and the common source line CSL by a corresponding string select transistor SST and gate select transistor GST, respectively. Such bit line BL and common source line CSL may be driven at the initial voltage Vo (e.g., by the address decoder 430) and page buffer circuit 410) to allow the first unselected NAND strings to fully discharge to the initial voltage Vo. During time period t4~t5, each of the second unselected NAND strings may maintain their floating state and remain electrically unconnected to corresponding bit lines BL and the common source line CSL. In contrast, during the time interval t6~t7, the channel voltage CHu2 of the second unselected NAND strings may be discharged from the boosted voltage VB to the initial voltage Vo (in the same manner as described with respect to the discharge of the first unselected NAND strings during time period t4~t5), by activating the voltages of the second unselected string selection lines SSLu2 and the second unselected ground selection lines GSLu2 in a form of a second pulse PLS2.

As such, the load when the voltage of the selected word line WLs decreases sequentially form the first voltage level VRa to the third voltage level VRc may be reduced by sequentially discharging the boosted channel voltage of the unselected NAND strings, and thus the voltage falling times Tf1 and Tf2 of the selected word line WLs may be reduced.

According to example embodiments, the setup time, that is, the voltage falling times Tf1 and Tf2 when the voltage of the selected word line WLs decreases may be controlled by adjusting the number of the first unselected NAND strings and the number of the second unselected NAND strings. For example, the intermediate voltage VB' may be lowered as the number of the first unselected NAND strings is increased to thereby discharge more of the unselected NAND strings during the voltage falling time Tf1.

As such, the load when the voltage of the selected word line WLs decreases may be reduced by discharging the boosted channel voltage of the unselected NAND string together, and thus the voltage falling times Tf1 and Tf2 of the selected word line WLs may be reduced.

Figures 14, 15:
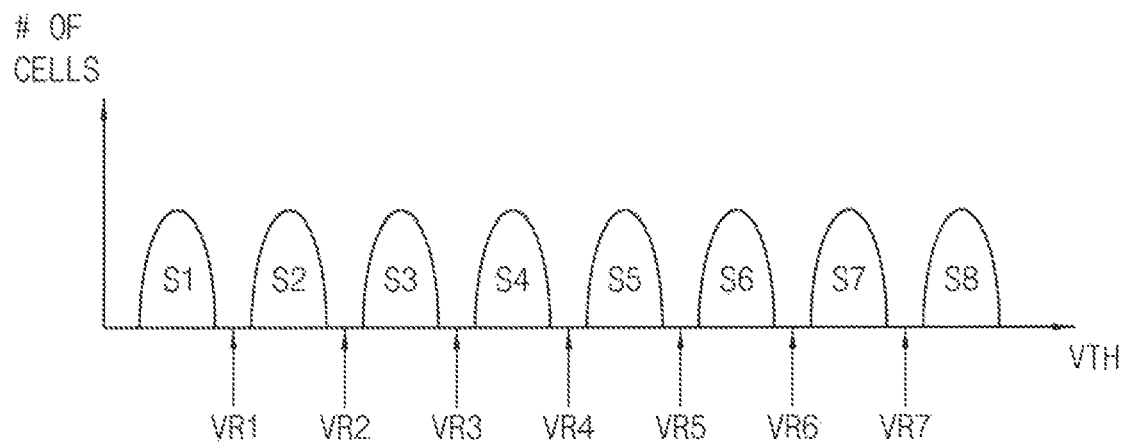
FIGS. 14, 15 and 16 are diagrams for describing an example read sequence for a read operation method according to example embodiments.
Figure 16:
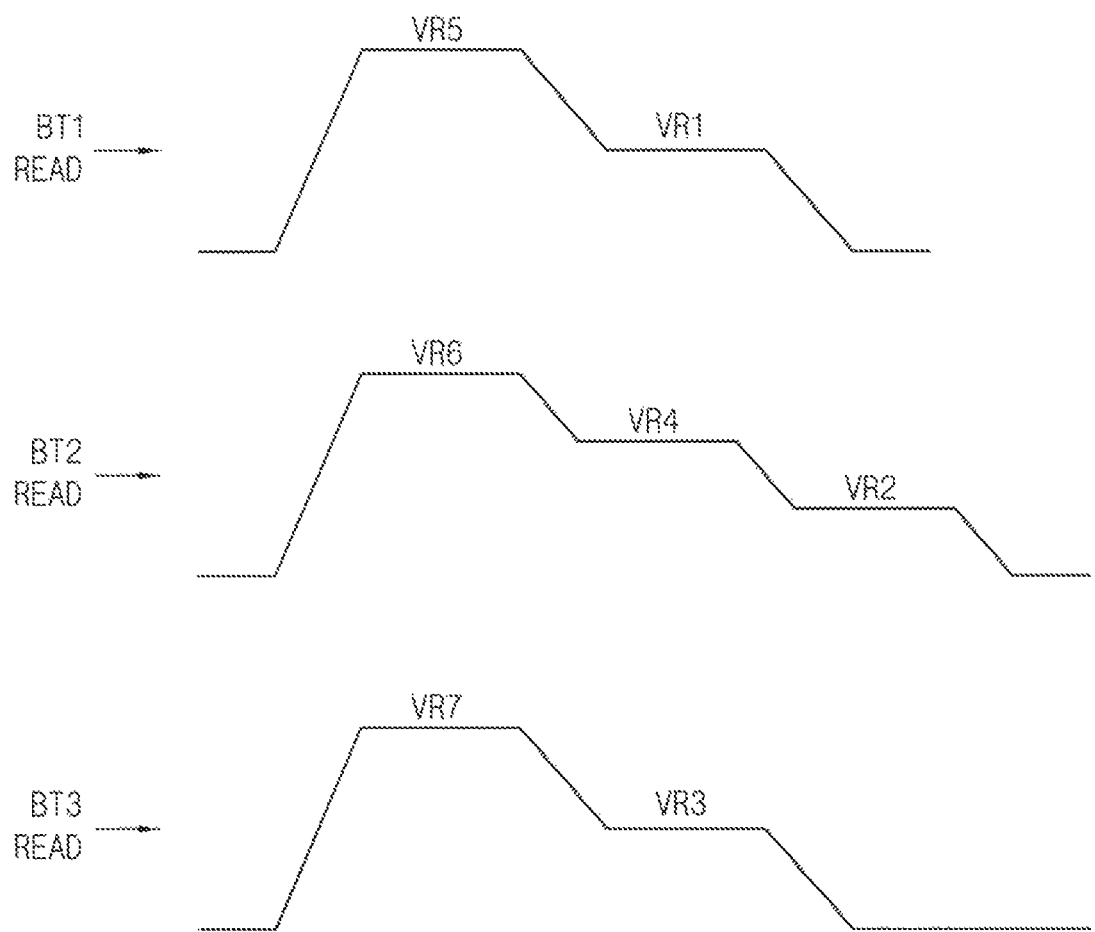

FIGS. 14, 15 and 16 are diagrams for describing an example read sequence for a read operation method according to example embodiments.

FIG. 14 illustrates first through eighth states S1~S8 of a triple level cell (TLC) memory where each memory cell of the TLC memory may store three data bits. Each memory cell may be a memory transistor having a charge storage layer interposed between a control gate and a channel, where charge stored in such charge storage layer during programming affects a threshold voltage VTH of the memory transistor. In FIG. 14, the horizontal axis represents a threshold voltage VTH of memory cells and the vertical axis represents the number of the memory cells corresponding to the threshold voltage VTH. The first through eighth states S1~S8 may be distinguished by applying first through seventh read voltage VR1~VR7.

FIG. 15 illustrates an example of bit values corresponding to the first through eighth states S1~S8. The first through eighth states S1~S8 may be represented by 'BT3 BT2 BT1', that is, different values of first, second and third bits BT1, BT2 and BT3. For example, as illustrated in FIG. 15, the first state corresponds to '111', the second state corresponds to '110', the third state corresponds to '100', the fourth state corresponds to '000', the fifth state corresponds to '010', the sixth state corresponds to '011', the seventh state corresponds to '001', and the eighth state corresponds to '101'.

In this case, the first bit BT1 may be determined using the first read voltage VR1 and the fifth read voltage VR5, the second bit BT2 may be determined using the second read voltage VR2, the fourth read voltage V4 and the sixth read voltage VR6, and the third bit BT3 may be determined using the third read voltage VR3 and the seventh read voltage VR7.

FIG. 16 illustrates a high-to-low read sequence corresponding to the example of FIG. 15.

In case of reading the first bit BT1, the fifth read voltage VR5 may be applied to the selected word line for the first sensing operation and the first read voltage VR1 may be applied to the selected word line for the second sensing operation as described with reference to FIGS. 10 and 11.

In case of reading the second bit BT2, the sixth read voltage VR6, the fourth read voltage VR4 and the second read voltage VR2 may be applied sequentially to the selected word line for the first, second and third sensing operations as described with reference to FIGS. 12 and 13.

In case of reading the third bit BT3, the seventh read voltage VR7 and the third read voltage VR3 may be applied sequentially to the selected word line for the first and second sensing operations as described with reference to FIGS. 11 and 12.

Even though according to example embodiments have been described for the TLC, those skilled in the art may easily understood that also the example embodiment may be applied to other multiple level cell (MLC) memories where the memory cells store two bits and four or more bits.

Figure 17:
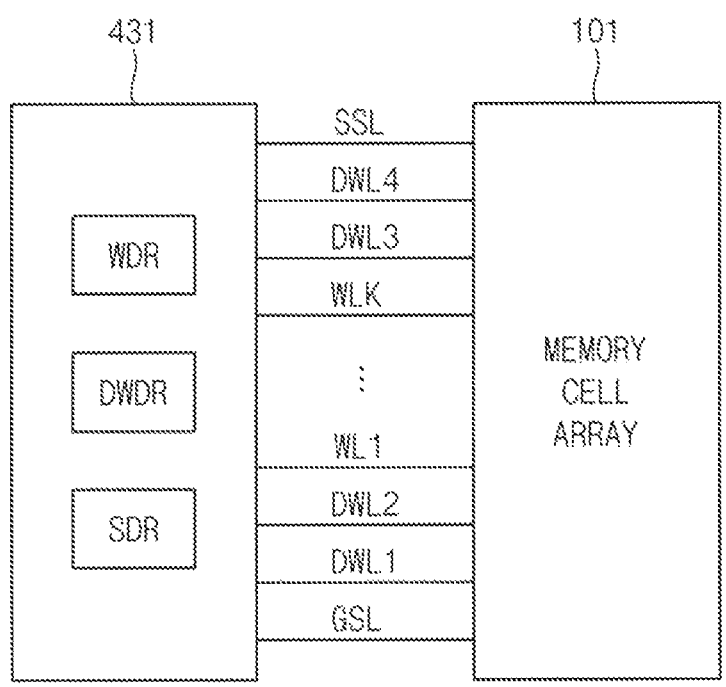
FIG. 17 is a block diagram illustrating a nonvolatile memory device according to example embodiments.
Figure 18:
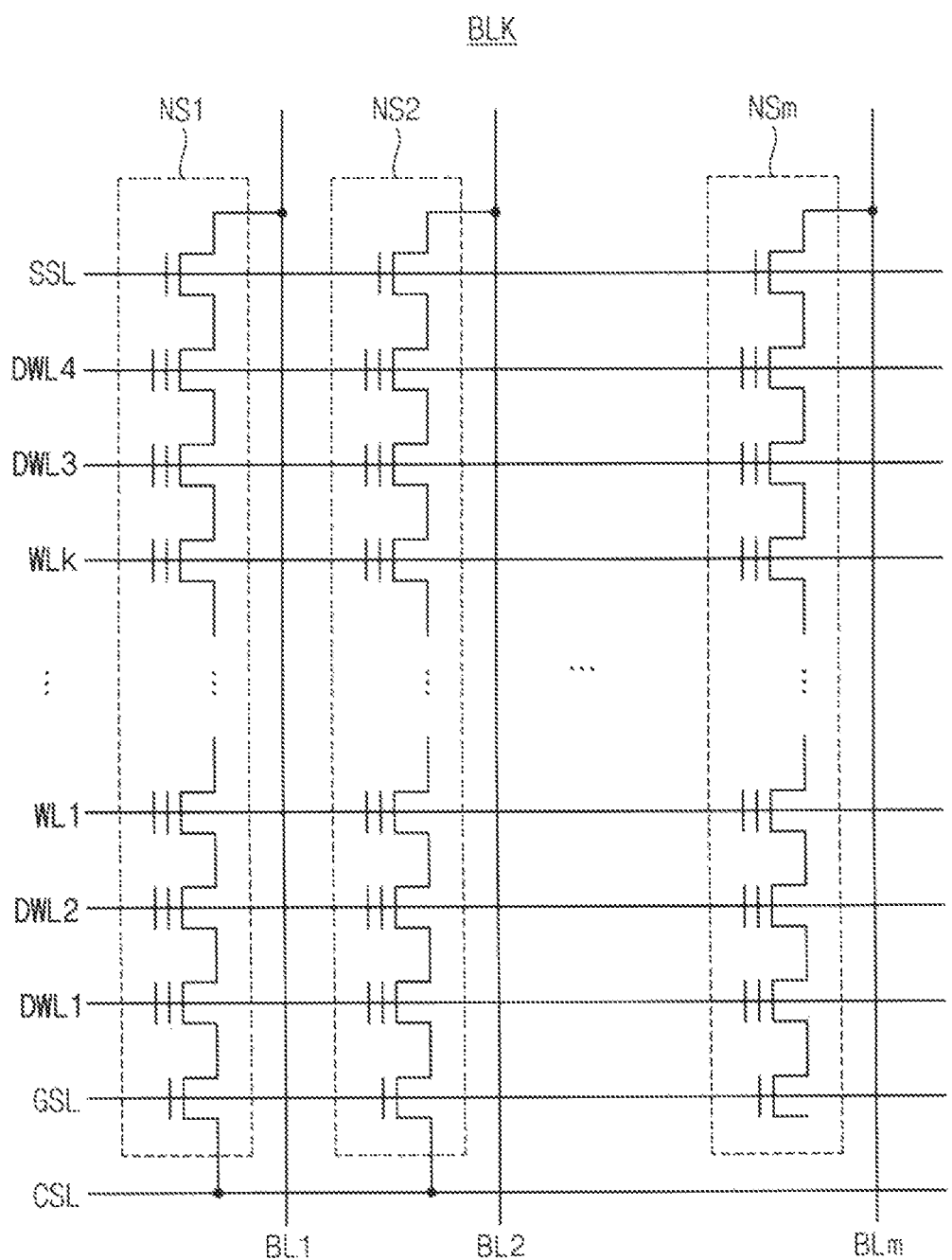
FIG. 18 is a circuit diagram illustrating an example embodiment of a memory cell array included in the nonvolatile memory device of FIG. 17.

FIG. 17 is a block diagram illustrating a nonvolatile memory device according to example embodiments, and FIG. 18 is a circuit diagram illustrating an example embodiment of a memory cell array included in the nonvolatile memory device of FIG. 17. The descriptions repeated with FIGS. 3 through 8 are omitted.

Referring to FIG. 17, a nonvolatile memory device 31 may include a memory cell array 101 and an address decoder 431. Even though not illustrated in FIG. 17, the nonvolatile memory device 31 may further include a page buffer circuit 410, a data input/output circuit 420, a control circuit 450 and a voltage generator 460, etc. as described with reference to FIG. 4. Address decoder 431 and memory cell array 101 of FIG. 17 may form the address decoder 430 and memory cell array 100 and be implemented in the nonvolatile memory device 30 of FIG. 4 (e.g., FIGS. 17 and 18 in this instance provides further details of address decoder 430 and memory cell array 100 of FIG. 4).

The memory cell array 101 may be coupled to the address decoder 431 through a plurality of string selection lines SSL, a plurality of word lines WL1~WLK, a plurality of dummy word lines DWL1~DWL4 and a plurality of ground selection lines GSL.

The address decoder 431 may include a word line driver WDR configured to drive the plurality of word lines WL1~WLK, a dummy word line driver DWDR configured to drive the plurality of dummy word lines DWL1~DWL4 and a selection line driver SDR configured to drive the plurality of string selection lines SSL and the plurality of ground selection lines GSL.

For convenience of illustration, FIG. 18 illustrates only the NAND strings NS1~NSm that are connected to one string selection line SSL and one ground selection line GSL among the plurality of NAND strings in a memory block BLK. As described with reference to FIGS. 6 and 7, the memory block BLK may have the three-dimensional structure. The drivers WDR, DWDR and SDR may drive the lines SSL, GSL, WL and DWL based on the voltages provided from the voltage generator 460 in FIG. 4.

Referring to FIG. 18, the memory block BLK may include a plurality of NAND strings NS1~NSm connected between a plurality of bit lines BL1~BLm and a common source line CSL. Each of the NAND strings NS1~NSm may include a string selection transistor controlled by the string selection line SSL, dummy cells controlled by the dummy word lines DWL1~DWL4, memory cells controlled by the word lines WL1~WLK and a ground selection transistor controlled by the ground selection line GSL. Even though the two dummy cells are in each end portion of each NAND string in FIG. 18, the number of the dummy cells is not limited thereto.

Figure 19:
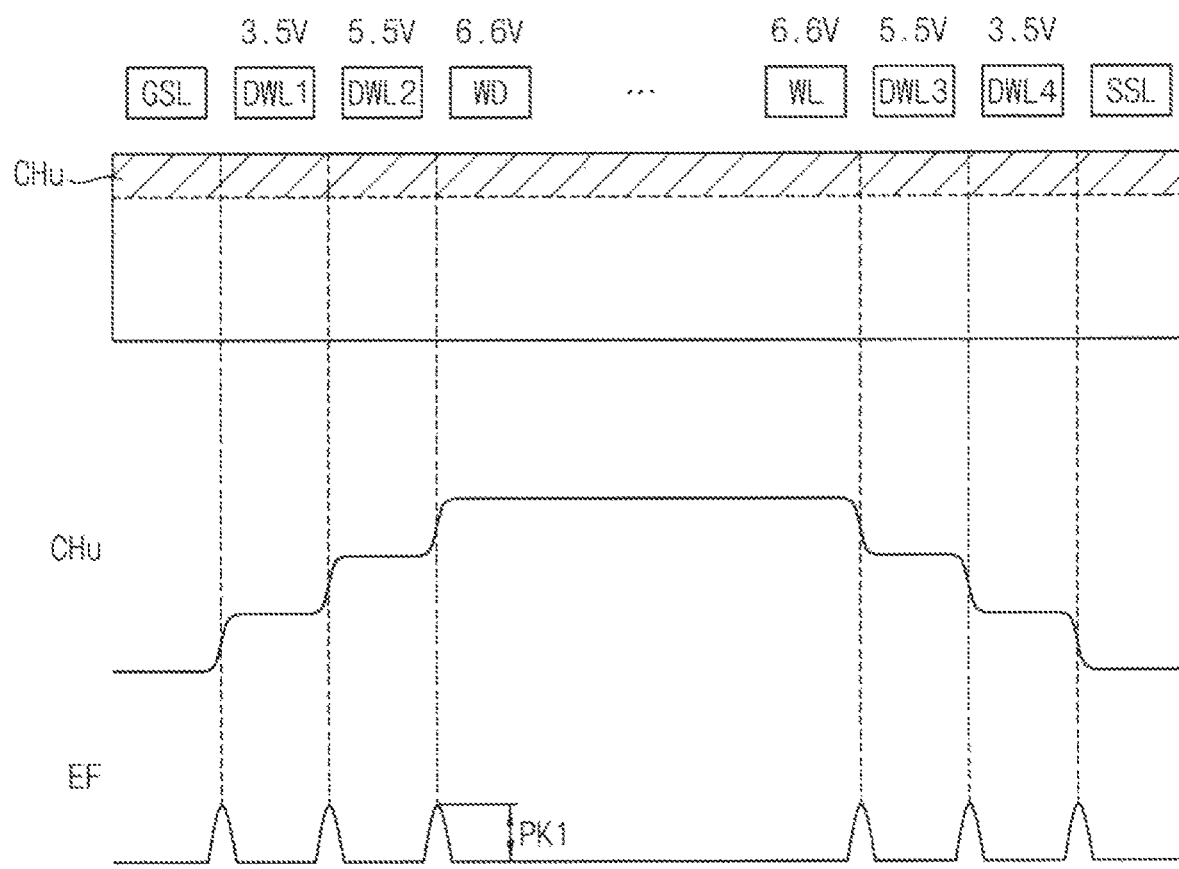
FIG. 19 is a diagram to illustrate a method of driving dummy word lines and a corresponding device according to example embodiments.
Figure 20:
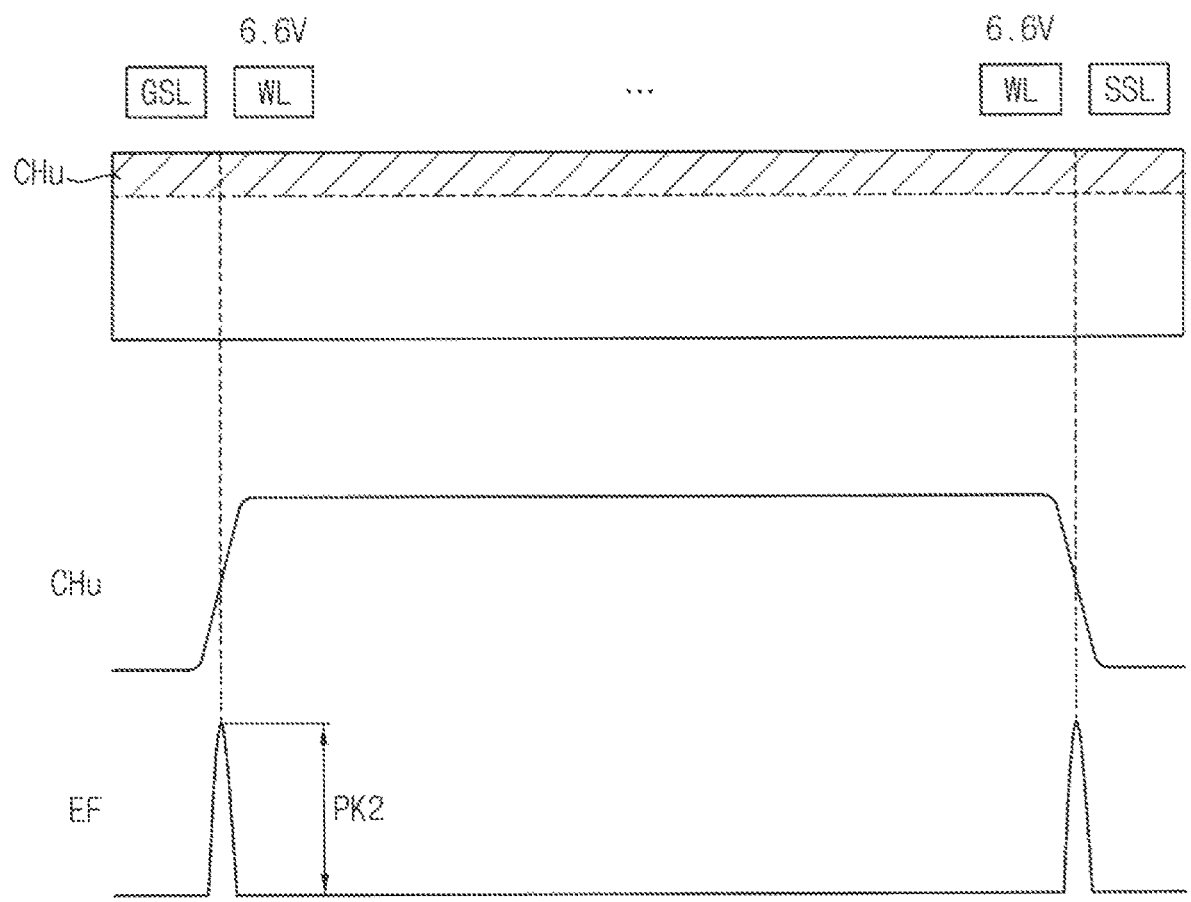
FIG. 20 illustrates a device in which a dummy word line is not implemented, as a comparative example.

FIG. 19 is a diagram to illustrate a method of driving dummy word lines and a corresponding device according to example embodiments. FIG. 20 illustrates a device in which a dummy word line is not implemented, as a comparative example.

In a read operation and/or a program operation, a relatively high voltage (e.g., 6.6V) is applied to the word line WL as illustrated in FIG. 20. In this case, the channel CHu of the floated unselected NAND string is formed only under the word line WL and thus the voltage of the channel CHu decreases abruptly at the end portions of the NAND string. Accordingly, a peak value PK2 of the electric field EF may increase and thus errors due to hot carrier injection (HCI) may be caused.

Dummy cells may be disposed at the end portions of the NAND string that are controlled by the dummy word lines DWL1~DWL4 as described with reference to FIGS. 17 and 18 and shown in FIG. 19.

For example, as illustrated in FIG. 19, the first and second dummy lines DWL1 and DWL2 may be disposed at the ends of the NAND string near the ground selection line GSL and the third and fourth dummy lines DWL3 and DWL4 may be disposed at the end portion near the string selection line SSL According to example embodiments, the sequentially decreasing voltages may be applied to the dummy word lines as the dummy word line is closer to the selection lines SSL and GSL. For example, as illustrated in FIG. 19, a relatively high voltage (e.g., 5.5V) may be applied to the second and third dummy word lines DWL2 and DWL3 and a relatively low voltage (e.g., 3.6V) may be applied to the first and fourth dummy word lines DWL1 and DWL4.

In this, case, the voltage of the channel CHu of the unselected NAND string may be decreased sequentially. Accordingly, the peak value PK1 at the end portion of the NAND string may be decreased, and thus the errors due to HCI may be reduced. The dummy word lines may be formed about dummy memory cells with similar structure to the memory cells described herein. However, data may not be read from such dummy memory cells (e.g., to page buffer circuit 410 and/or to a source external to the memory device 31).

Figure 21:
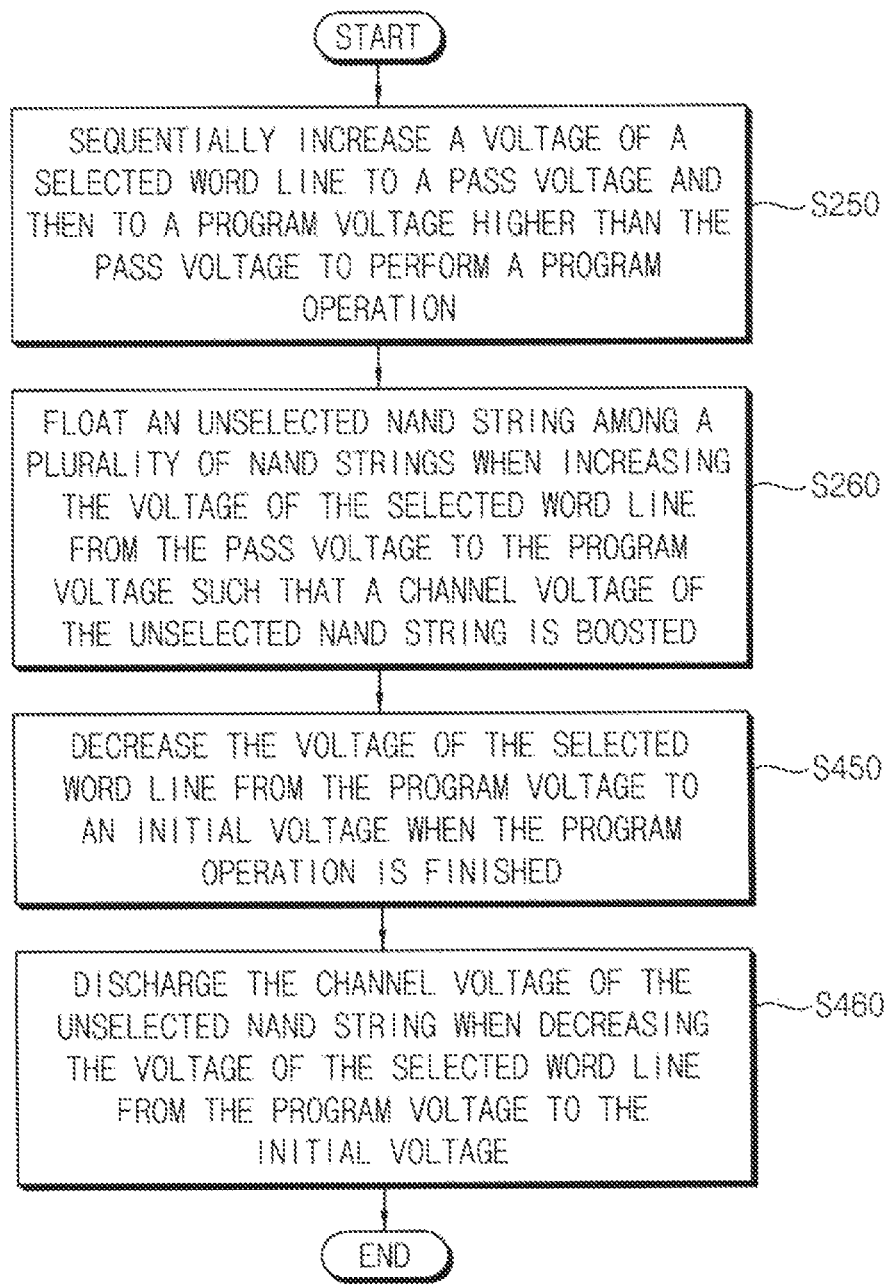
FIG. 21 is a flow chart illustrating a program operation method in a memory device according to example embodiments.

FIG. 21 is a flow chart illustrating a program operation method in a memory device according to example embodiments.

Referring to FIG. 21, a voltage of a selected word line may be increased sequentially to a pass voltage and then to a program voltage higher than the pass voltage to perform a program operation (S250). An unselected NAND string among a plurality of NAND strings is floated when increasing the voltage of the selected word line from the pass voltage to the program voltage such that a channel voltage of the unselected NAND string is boosted (S260).

The voltage of the selected word line is decreased from the program voltage to an initial voltage when the program operation is finished (S450). The channel voltage of the unselected NAND string is discharged when decreasing the voltage of the selected word line from the program voltage to the initial voltage (S460).

As such, the method of performing the program operation of the memory device according to example embodiments may reduce the load of the selected word line by changing the voltage of the selected word line and the channel voltage of the unselected NAND string in the same direction and at the same time. Through such reduction of the load of the selected word line, a voltage setup time may be reduced and an operation speed of the memory device may be enhanced.

Figure 22:
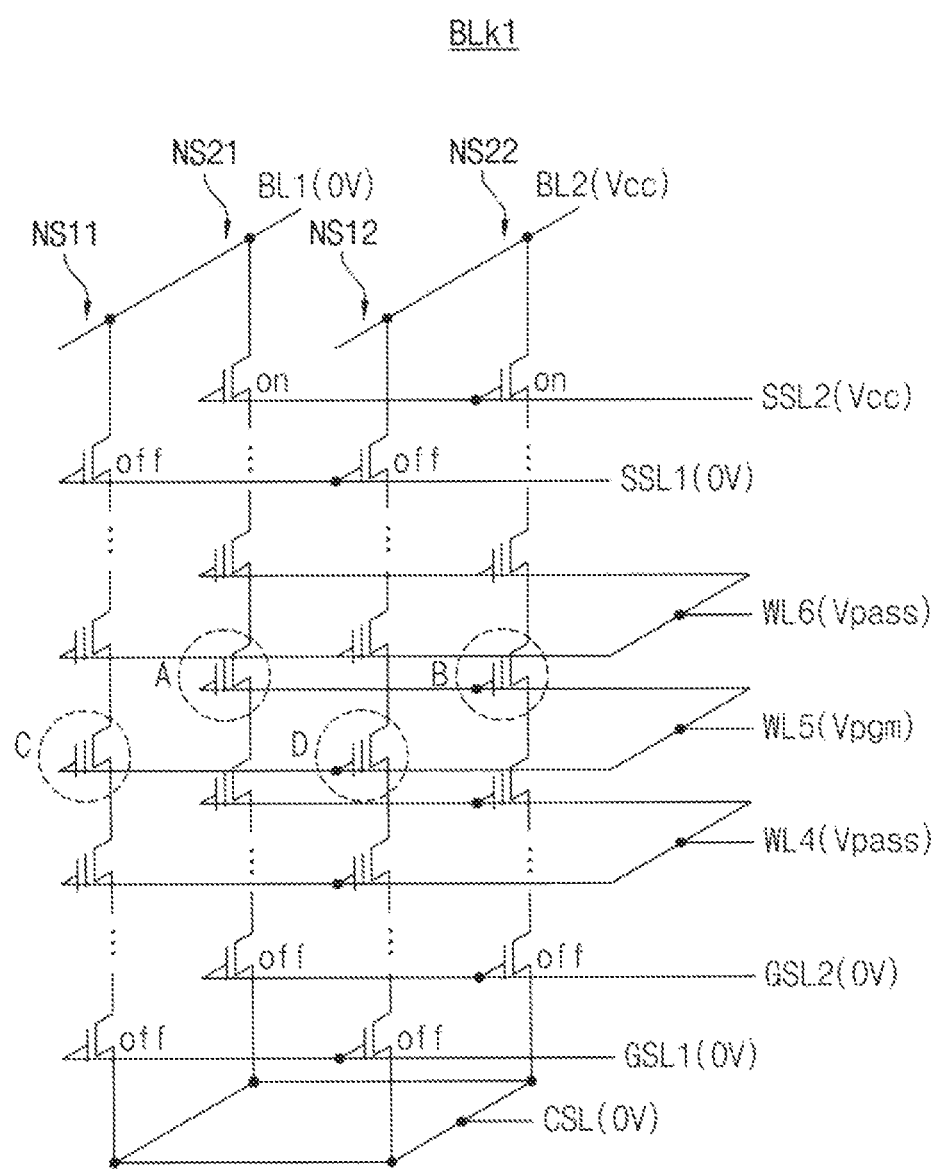
FIG. 22 is a circuit diagram illustrating a program bias condition of a three-dimensional flash memory device.

FIG. 22 is a circuit diagram illustrating a program bias condition of a three-dimensional flash memory device.

For convenience of description, NAND strings NS11 and NS21 connected to a first bit line BL1 and NAND strings NS12 and NS22 connected to a second bit line BL2 are illustrated in FIG. 22.

The first bit line BL1 may be a program bit line to which a program permission voltage (e.g., 0 V) is applied, and the second bit line BL2 may be a program inhibition bit line to which a program inhibition voltage such as a power supply voltage Vcc is applied. If the NAND string NS21 among the NAND strings NS11 and NS21 is selected, during a program operation, a voltage of 0 V may be applied to a first string selection line SSL1, and the power supply voltage Vcc may be applied to a second string selection line SSL2.

The voltage of 0 V may be applied to ground selection lines GSL1 and GSL2. Furthermore, a voltage (e.g., Vcc) higher than 0 V may be applied to a common source line CSL. A program voltage Vpgm (e.g., 18 V) may be applied to a selected word line (e.g., WL5) and a pass voltage Vpass (e.g., 8 V) may be applied to unselected word lines (e.g., WL4 and WL6).

Under the program bias condition, a voltage of 18 V may be applied to a gate of a memory cell A having a channel voltage of 0 V. Since a strong electric field is formed between the gate and a channel of the memory cell A, the memory cell A may be programmed. However, since respective channels of memory cells C and D are in a floating state, channel voltages thereof may be boosted up to, for example, about 8 V, and thus, the memory cells C and D may not be programmed. The memory cell B may not be programmed because a weak electric field is formed between the gate of the memory cell B and the channel.

According to example embodiments, in the program operation, the load of the selected word line (e.g., WL5) may be reduced by associating the change of the voltage of the selected word line (e.g., WL5) and the change of the channel voltage of the unselected NAND strings (e.g., NS11, NS12) in the same direction.

Figure 23:
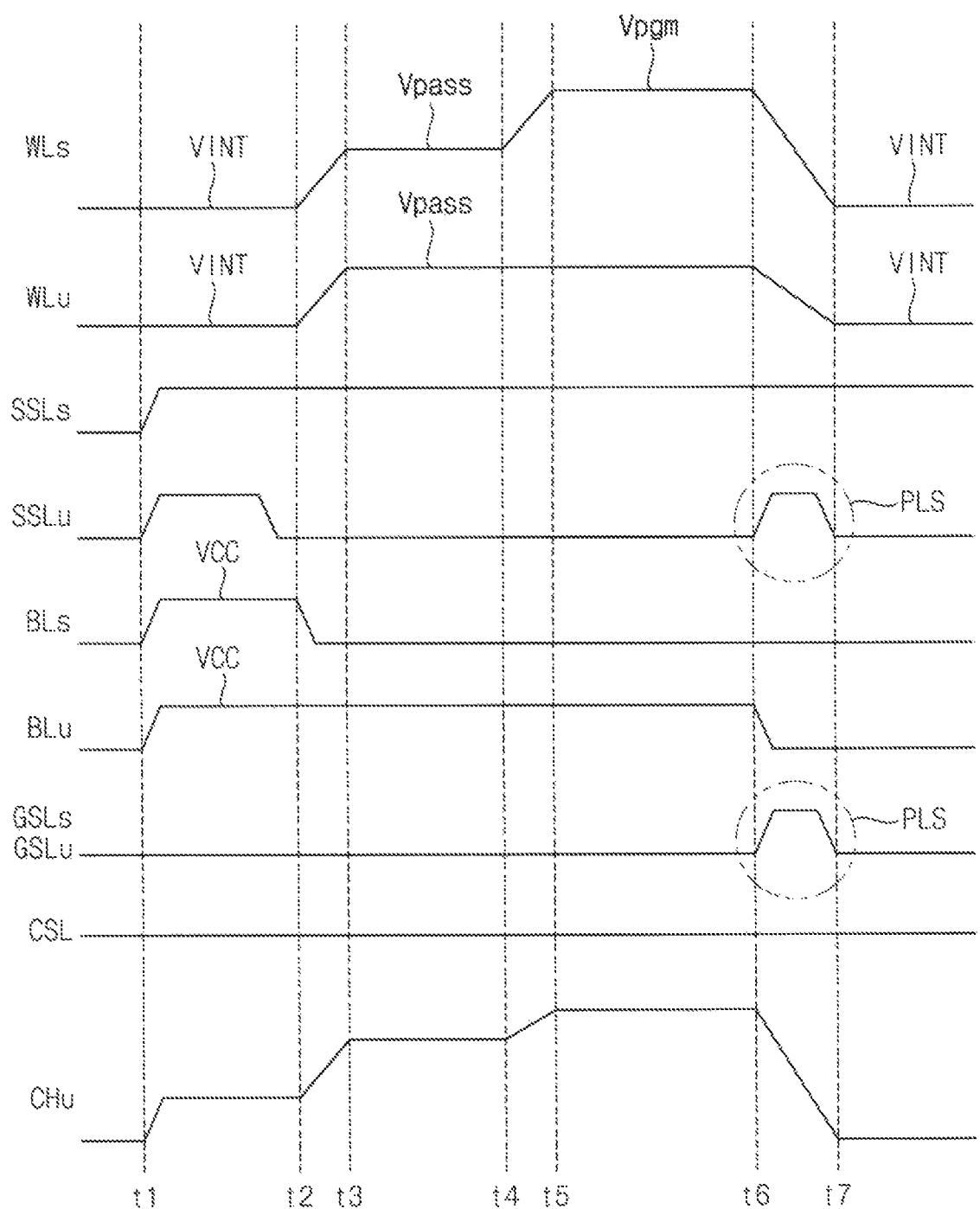
FIG. 23 is a timing diagram illustrating a method of performing a program operation in a memory device according to example embodiments.

FIG. 23 is a timing diagram illustrating a method of performing a program operation in a memory device according to example embodiments.

The voltage levels of the selected word line WLs, the unselected word line WLu, selected string selection line SSLs, the unselected string selection line SSLu, the selected bit line BLs, the unselected bit line BLu, the common source line CSL and the channel CHu of the unselected NAND string are illustrated based on time points t1~t7 in FIG. 23. The example program operation of FIG. 23 may be understood with reference to FIG. 22. The repeated descriptions are omitted and only boosting and discharging of the channel voltage of the unselected NAND string are described.

The voltage of the selected word line WLs may be increased sequentially to a pass voltage Vpass and then to a program voltage Vpgm higher than the pass voltage Vpass to perform a program operation. As illustrated in FIG. 23, the voltage of the selected word line WLs may be increased from the initial voltage Vo to the pass voltage Vpass during time interval t2~t3 and then increased from the pass voltage Vpass to the program voltage Vpgm during time interval t4~t5.

According to example embodiments, the voltage of the unselected string selection line SSLu and the voltage of the unselected ground selection line GSLu may be deactivated when sequentially increasing the voltage of the selected word line (t2~t3, t4~t5). Accordingly, the channel voltage CHu of the unselected NAND string may be increased sequentially by floating the unselected NAND string. As such, the load when the voltage of the selected word line WLs increases may be reduced by floating the unselected NAND string to boost the channel voltage CHu of the unselected NAND string together, and thus the voltage rising time of the selected word line WLs may be reduced.

During time interval t6~t7 when the program operation is finished, the voltage of the selected word line WLs is decreased from the program voltage Vpgm to an initial voltage Vo.

According to example embodiments, at least one of the voltage of the unselected string selection line SSLu and the voltage of the unselected ground selection line GSLu may be activated when decreasing the voltage of the selected word line WLs from the program voltage Vpgm to the initial voltage Vo (t6~t7). For example, as illustrated in FIG. 23, the voltages of the unselected string selection line SSLu and the unselected ground selection line GSLu may be activated in a form of a pulse PLS. Thus, the channel voltage CHu may be discharged from the boosted voltage to the initial voltage. As such, the load when the voltage of the selected word line WLs decreases may be reduced by discharging the boosted channel voltage of the unselected NAND string together, and thus the voltage falling time of the selected word line WLs may be reduced.

As such, the setup time may be reduced through the load reduction due to boosting or discharging of the channel voltage of the unselected NAND string, and thus the read speed of the memory device may be enhanced.

Figure 24:
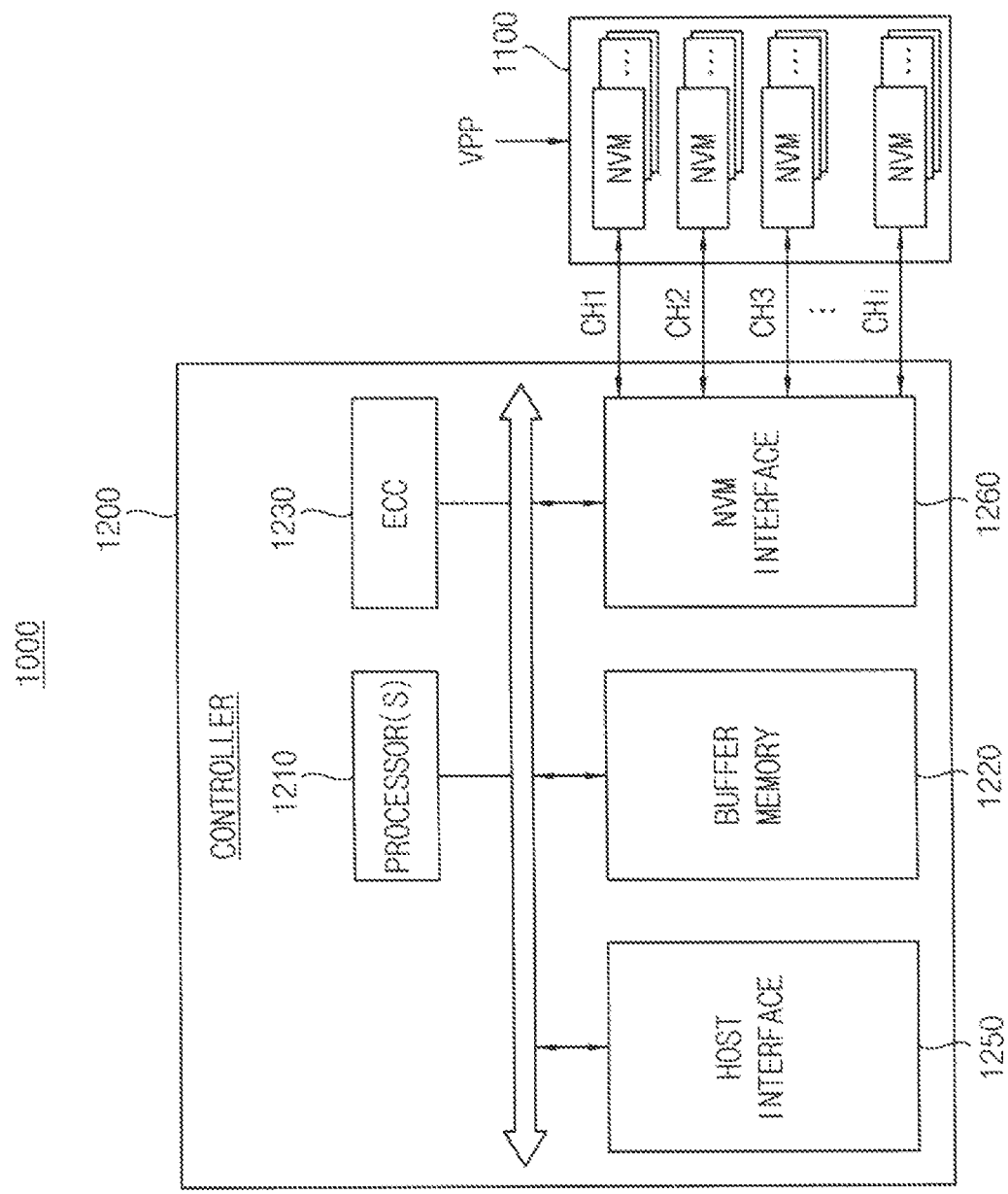
FIG. 24 is a block diagram illustrating a solid state disk or solid state drive (SSD) according to example embodiments.

FIG. 24 is a block diagram illustrating a solid state disk or solid state drive (SSD) according to example embodiments.

Referring to FIG. 24, SSD 1000 includes multiple nonvolatile memory devices 1100 and an SSD controller 1200.

The nonvolatile memory devices 1100 may be configured optionally to receive a high voltage VPP. The nonvolatile memory devices 1100 may the above-described memory devices according to example embodiments. The nonvolatile memory devices 1100 may reduce the load of the selected word line by associating the change of the voltage of the selected word line and the change of the channel voltage of the unselected NAND string in the same direction.

The SSD controller 1200 is connected to the nonvolatile memory devices 1100 through multiple channels CH1 to CHi. The SSD controller 1200 includes one or more processors 1210, a buffer memory 1220, an error correction circuit (ECC circuit) 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, The ECC circuit 1230 corrects an error of data recovered from the nonvolatile memory devices 1100.

The present inventive concept may be applied to nonvolatile memory devices including a plurality of NAND strings and systems including the nonvolatile memory device. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept. For example, while embodiments describe concurrent start and end times of charging and discharging the unselected NAND strings with the start and end times of charging and discharging the selected word line WLs, different start and end times may be implemented. For example, start times of charging and discharging the unselected NAND strings may occur before the corresponding start and end times of the charging and discharging of the selected word line WLs. In addition, while simultaneous charging and discharging of the unselected NAND strings with the corresponding charging and discharging of the selected word line, such operations may occur separately (e.g., with charging and discharging of the unselected NAND strings occurring before the corresponding charging and discharging of the selected word line).

What is claimed is:

1. A method of operating a memory device including a plurality of NAND strings, the method comprising:
   increasing a voltage of a selected word line;
   floating an unselected NAND string among the plurality of NAND strings when the voltage of the selected word line is increased such that a channel voltage of the unselected NAND string is boosted;
   decreasing the voltage of the selected word line; and
   discharging the channel voltage of the unselected NAND string when the voltage of the selected word line is decreased.

2. The method of claim 1, wherein discharging the channel voltage of the unselected NAND string includes electrically connecting the unselected NAND string to a bit line and a source line when a read voltage of the selected word line is decreased in a read operation.

3. The method of claim 1, wherein discharging the channel voltage of the unselected NAND string includes electrically connecting the unselected NAND string to at least one of a bit line and a source line when a program voltage of the selected word line is decreased in a program operation.

4. The method of claim 1,
   wherein increasing the voltage of the selected word line includes increasing the voltage of the selected word line to a first read voltage to perform a first sensing operation, and
   wherein decreasing the voltage of the selected word line includes decreasing the voltage of the selected word line from the first read voltage to a second read voltage to perform a second sensing operation, the second read voltage being lower than the first read voltage.

5. The method of claim 4, wherein floating the unselected NAND string includes deactivating an unselected string selection line and an unselected ground selection line during a time period when the voltage of the selected word line is increased to the first read voltage, the unselected string selection line connected to the unselected NAND string to control an electrical connection between the unselected NAND string and a bit line, the unselected ground selection line connected to the unselected NAND string to control an electrical connection between the unselected NAND string and a source line.

6. The method of claim 4, wherein discharging the channel voltage of the unselected NAND string includes activating an unselected string selection line and an unselected ground selection line by providing corresponding voltages in a form of a pulse on the unselected string selection line and the unselected ground selection line when the voltage of the selected word line is decreased from the first read voltage to the second read voltage, the unselected string selection line connected to the unselected NAND string to control an electrical connection between the unselected NAND string and a bit line, the unselected ground selection line connected to the unselected NAND string to control an electrical connection between the unselected NAND string and a source line.

7. The method of claim 4, further comprising increasing a voltage of a word line adjacent to the selected word line when decreasing the voltage of the selected word line from the first read voltage to the second read voltage.

8. The method of claim 4, wherein decreasing the voltage of the selected word line further includes decreasing the voltage of the selected word line from the second read voltage to a third read voltage to perform a third sensing operation, the third read voltage being lower than the second read voltage.

9. The method of claim 8, wherein discharging the channel voltage of the unselected NAND string includes:
   activating an unselected string selection line and an unselected ground selection line by providing corresponding voltages in a form of a first pulse on the unselected string selection line and the unselected ground selection line when the voltage of the selected word line is decreased from the first read voltage to the second read voltage, the unselected string selection line connected to the unselected NAND string to control an electrical connection between the unselected NAND string and a bit line, the unselected ground selection line connected to the unselected NAND string to control an electrical connection between the unselected NAND string and a source line; and
   activating the unselected string selection line and the unselected ground selection line by providing corresponding voltages in a form of a second pulse when the voltage of the selected word line is decreased from the second read voltage to the third read voltage.

10. The method of claim 9, wherein at least one of pulse widths or voltage levels of the first pulse and the second pulse are different from each other.

11. The method of claim 8, wherein discharging the channel voltage of the unselected NAND string includes:
   discharging channel voltages of first unselected NAND strings when the voltage of the selected word line is decreased from the first read voltage to the second read voltage; and
   discharging channel voltages of second unselected NAND strings when the voltage of the selected word line is decreased from the second read voltage to the third read voltage.

12. The method of claim 11, wherein a setup time when the voltage of the selected word line is decreased is responsive to a number of the first unselected NAND strings and a number of the second unselected NAND strings.

13. The method of claim 1,
   wherein increasing the voltage of the selected word line includes sequentially increasing the voltage of the selected word line to a pass voltage and then to a program voltage higher than the pass voltage to perform a program operation, and
   wherein decreasing the voltage of the selected word line includes decreasing the voltage of the selected word line from the program voltage to an initial voltage.

14. The method of claim 13, wherein floating the unselected NAND string includes maintaining an unselected string selection line and an unselected ground selection line in a deactive state when sequentially increasing the voltage of the selected word line to the pass voltage and then to the program voltage, the unselected string selection line connected to the unselected NAND string to control an electrical connection between the unselected NAND string and a bit line, the unselected ground selection line connected to the unselected NAND string to control an electrical connection between the unselected NAND string and a source line.

15. The method of claim 13, wherein discharging the channel voltage of the unselected NAND string includes activating at least one of an unselected string selection line and an unselected ground selection line by providing one or more corresponding voltages in a form of a pulse when the voltage of the selected word line is decreased from the program voltage to the initial voltage, the unselected string selection line connected to the unselected NAND string to control an electrical connection between the unselected NAND string and a bit line, the unselected ground selection line connected to the unselected NAND string to control an electrical connection between the unselected NAND string and a source line.

16. The method of claim 1, further comprising applying sequentially decreasing voltages to a plurality of dummy word lines that control a plurality of dummy cells disposed at end portions of the NAND strings.

17. A method of performing a read operation of a memory device including a plurality of NAND strings, the method comprising:
   increasing a voltage of a selected word line to a first read voltage to perform a first sensing operation;
   floating an unselected NAND string among the plurality of NAND strings when the voltage of the selected word line is increased to the first read voltage such that a channel voltage of the unselected NAND string is boosted;
   decreasing the voltage of the selected word line from the first read voltage to a second read voltage to perform a second sensing operation, the second read voltage being lower than the first read voltage; and
   discharging the channel voltage of the unselected NAND string when the voltage of the selected word line is decreased from the first read voltage to the second read voltage.

18. The method of claim 17, wherein floating the unselected NAND string includes deactivating an unselected string selection line and an unselected ground selection line when the voltage of the selected word line is increased to the first read voltage, the unselected string selection line connected to the unselected NAND string to control an electrical connection between the unselected NAND string and a bit line, the unselected ground selection line connected to the unselected NAND string to control an electrical connection between the unselected NAND string and a source line.

19. The method of claim 17, wherein discharging the channel voltage of the unselected NAND string includes activating an unselected string selection line and an unselected ground selection line by providing voltages in a form of a pulse when the voltage of the selected word line is decreased from the first read voltage to the second read voltage, the unselected string selection line connected to the unselected NAND string to control an electrical connection between the unselected NAND string and a bit line, the unselected ground selection line connected to the unselected NAND string to control an electrical connection between the unselected NAND string and a source line.

20. A memory device comprising:
a memory cell array including a plurality of NAND strings; and
a control circuit configured to float an unselected NAND string among the plurality of NAND strings when a voltage of a selected word line is increased such that a channel voltage of the unselected NAND string is boosted and configured to discharge the channel voltage of the unselected NAND string when the voltage of the selected word line is decreased.

* * * * *